US012757453B2

(12) United States Patent
Shirakawa et al.

(10) Patent No.: US 12,757,453 B2
(45) Date of Patent: Oct. 6, 2026

(54) SEMICONDUCTOR DEVICE

(71) Applicant: FUJI ELECTRIC CO., LTD., Kanagawa (JP)

(72) Inventors: Tohru Shirakawa, Matsumoto-city (JP); Yoshiharu Kato, Matsumoto-city (JP); Yuuki Oda, Matsumoto-city (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 243 days.

(21) Appl. No.: 18/542,818

(22) Filed: Dec. 18, 2023

(65) Prior Publication Data

US 2024/0243169 A1 Jul. 18, 2024

(30) Foreign Application Priority Data

Jan. 17, 2023 (JP) ................................. 2023-005467

(51) Int. Cl.

*H10D 62/10* (2025.01)
*H10D 8/00* (2025.01)
*H10D 84/80* (2025.01)
*H10W 20/41* (2026.01)

(52) U.S. Cl.

CPC ........... *H10D 62/117* (2025.01); *H10D 8/422* (2025.01); *H10D 84/811* (2025.01); *H10W 20/425* (2026.01)

(58) Field of Classification Search

CPC ........................... H10D 62/117; H10D 62/141
See application file for complete search history.

(56) References Cited

U.S. PATENT DOCUMENTS

2016/0315140 A1 10/2016 Iwasaki
2020/0126973 A1* 4/2020 Kamibaba .............. H10D 8/422
2021/0376167 A1 12/2021 Soneda
2021/0384190 A1 12/2021 Umeki
2021/0384335 A1 12/2021 Sako (Continued)

FOREIGN PATENT DOCUMENTS

JP 2015144232 A 8/2015
JP 2018067624 A 4/2018

(Continued)

OTHER PUBLICATIONS

Office Action issued for counterpart Japanese Application No. 2023-005467, transmitted from the Japanese Patent Office of Sep. 1, 2026 (drafted on Aug. 21, 2026).

*Primary Examiner* — Shih Tsun A Chou

(57) ABSTRACT

Provided is a semiconductor device including: a plurality of trench portions, one or more mesa portions which are sandwiched between two trench portions; an upper-surface electrode which does not contain a metal having a higher melting point than a material of the semiconductor substrate; and a barrier metal which contains the metal having the higher melting point than the material of the semiconductor substrate, and including: a first region where the barrier metal is not provided between the trench portion and the upper-surface electrode and where the barrier metal is provided between the mesa portion in contact with the trench portion not provided with the barrier metal and the upper-surface electrode; and a second region where the barrier metal is provided between the trench portion and the upper-surface electrode.

23 Claims, 12 Drawing Sheets

(56) References Cited

U.S. PATENT DOCUMENTS

| | | | |
|---|---|---|---|
| 2022/0013634 A1 | 1/2022 | Nitta | |
| 2022/0013636 A1 | 1/2022 | Otsuka | |
| 2022/0037514 A1 | 2/2022 | Harada | |
| 2022/0059680 A1 | 2/2022 | Chen | |
| 2022/0102341 A1 | 3/2022 | Kudo | |
| 2022/0109044 A1 | 4/2022 | Takahashi | |
| 2022/0109063 A1 | 4/2022 | Takahashi | |
| 2022/0173094 A1 | 6/2022 | Yoshida | |

FOREIGN PATENT DOCUMENTS

| | | | |
|---|---|---|---|
| JP | 2020065000 | A | 4/2020 |
| JP | 2021190496 | A | 12/2021 |
| JP | 2021190657 | A | 12/2021 |
| JP | 2022014505 | A | 1/2022 |
| JP | 2022015861 | A | 1/2022 |
| JP | 2022025674 | A | 2/2022 |
| JP | 2022035157 | A | 3/2022 |
| JP | 2022056498 | A | 4/2022 |
| JP | 2022059446 | A | 4/2022 |
| JP | 2022059487 | A | 4/2022 |
| JP | 2022085461 | A | 6/2022 |
| WO | 2020080476 | A1 | 4/2020 |

* cited by examiner e–e e-e e–e

SEMICONDUCTOR DEVICE

The contents of the following patent application(s) are incorporated herein by reference:

NO. 2023-005467 filed in JP on Jan. 17, 2023

BACKGROUND

1. Technical Field

The present invention relates to a semiconductor device.

2. Related Art

Conventionally, a semiconductor device is known which includes a barrier metal containing titanium or the like (see Patent Documents 1 and 2, for example).

Patent Document 1: Japanese Patent Application Publication No. 2020-65000

Patent Document 2: Japanese Patent Application Publication No. 2021-190496

DESCRIPTION OF EXEMPLARY EMBODIMENTS

Figure 1:
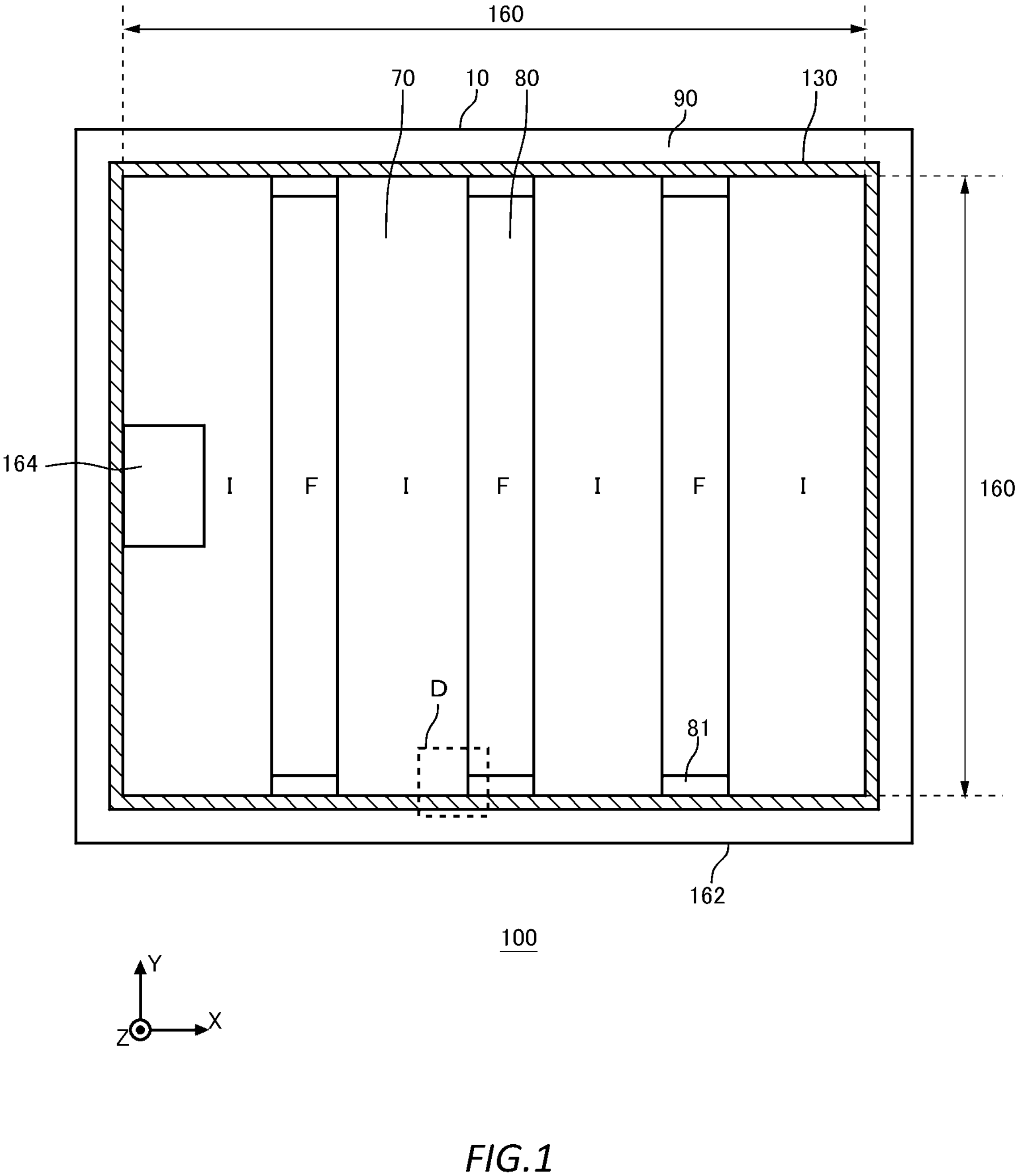
FIG. 1 illustrates a top view showing an example of a semiconductor device 100 according to one embodiment of the present invention.

Hereinafter, the present invention will be described through embodiments of the invention, but the following embodiments do not limit the invention according to claims. In addition, not all of the combinations of features described in the embodiments are essential to the solution of the invention.

In the present specification, one side in a direction parallel to a depth direction of a semiconductor substrate is referred to as "upper" and the other side is referred to as "lower". One surface of two principal surfaces of a substrate, a layer or other member is referred to as an upper surface, and the other surface is referred to as a lower surface. "Upper" and "lower" directions are not limited to a direction of gravity, or a direction in which a semiconductor device is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. It should be noted that a +Z axis direction and a −Z axis direction are directions opposite to each other. When the Z axis direction is described without describing the signs, it means that the direction is parallel to the +Z axis and the −Z axis.

In the present specification, orthogonal axes parallel to the upper surface and the lower surface of the semiconductor substrate are referred to as the X axis and the Y axis. In addition, an axis perpendicular to the upper surface and the lower surface of the semiconductor substrate is referred to as the Z axis. In the present specification, the direction of the Z axis may be referred to as the depth direction. In addition, in the present specification, a direction parallel to the upper surface and the lower surface of the semiconductor substrate may be referred to as a horizontal direction, including an X axis direction and a Y axis direction.

A phrase, an "upper surface side" may refer to a region from a center of the semiconductor substrate in the depth direction to the upper surface of the semiconductor substrate. Similarly, a region from the center of the semiconductor substrate in the depth direction to the lower surface of the semiconductor substrate may be referred to as a lower surface side.

In the present specification, a case where a term such as "same" or "equal" is mentioned may include a case where an error due to a variation in manufacturing or the like is included. The error is, for example, within 10%.

In the present specification, a conductivity type of doping region where doping has been carried out with an impurity is described as a P type or an N type. In the present specification, the impurity may particularly mean either a donor of the N type or an acceptor of the P type, and may be described as a dopant. In the present specification, doping means introducing the donor or the acceptor into the semiconductor substrate and turning it into a semiconductor presenting a conductivity type of the N type, or a semiconductor presenting conductivity type of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to an acceptor concentration set as a negative ion concentration, taking into account of polarities of charges. As an example, when the donor concentration is $N_D$ and the acceptor concentration is $N_A$, the net doping concentration at any position is given as $N_D$-$N_A$. In the present specification, the net doping concentration may be simply referred to as the doping concentration.

The donor has a function of supplying electrons to a semiconductor. The acceptor has a function of receiving electrons from the semiconductor. The donor and the acceptor are not limited to impurities themselves. For example, a VOH defect in which a vacancy (V), oxygen (O), and hydrogen (H) present in the semiconductor are attached together functions as the donor which supplies electrons. In the present specification, the VOH defect may be referred to as a hydrogen donor.

In the semiconductor substrate of the present specification, bulk donors of the N type are distributed throughout. A bulk donor is a dopant donor substantially uniformly contained in an ingot during the manufacture of the ingot from which the semiconductor substrate is made. The bulk donor in this example is an element other than hydrogen. A bulk donor dopant is, for example, phosphorous, antimony, arsenic, selenium, or sulfur, but the present invention is not limited to these. The bulk donor in this example is phosphorous. The bulk donor is also contained in a region of the P type. The semiconductor substrate may be a wafer cut out from a semiconductor ingot, or may be a chip obtained by singulating the wafer. The semiconductor ingot may be manufactured by any of a Czochralski method (CZ method), a magnetic field applied Czochralski method (MCZ method), or a float zone method (FZ method). The ingot in this example is manufactured by the MCZ method. An oxygen concentration contained in the substrate manufactured by the MCZ method is $1\times10^{17}$ to $7\times10^{17}/cm^3$. The oxygen concentration contained in the substrate manufactured by the FZ method is $1\times10^{15}$ to $5\times10^{16}/cm^3$. When the oxygen concentration is high, hydrogen donors tend to be easily generated. A bulk donor concentration may use a chemical concentration of bulk donors distributed throughout the semiconductor substrate, or may be a value between 90% and 100% of the chemical concentration. In addition, as the semiconductor substrate, a non-doped substrate not containing a dopant such as phosphorous may be used. In that case, the bulk donor concentration (D0) of the non-doped substrate is, for example, from $1\times10^{10}/cm^3$ or more and $5\times10^{12}/cm^3$ or less. The bulk donor concentration (D0) of the non-doped substrate is preferably $1\times10^{11}/cm^3$ or more. The bulk donor concentration (D0) of the non-doped substrate is preferably $5\times10^{12}/cm^3$ or less. Each concentration in the present invention may be a value at room temperature. As the value at room temperature, a value at 300 K (Kelvin) (about 26.9 degrees C.) may be used as an example.

In the present specification, a description of a P+ type or an N+ type means a higher doping concentration than that of the P type or the N type, and a description of a P− type or an N− type means a lower doping concentration than that of the P type or the N type. In addition, in the present specification, a description of a P++ type or an N++ type means a higher doping concentration than that of the P+ type or the N+ type. In the present specification, a unit system is an SI unit system unless otherwise noted. Although a unit of length is represented using cm, it may be converted to meters (m) before calculations.

A chemical concentration in the present specification indicates an atomic density of an impurity measured regardless of an electrical activation state. The chemical concentration can be measured by, for example, secondary ion mass spectrometry (SIMS). The net doping concentration described above can be measured by capacitance-voltage profiling (CV method). In addition, a carrier concentration measured by spreading resistance profiling (SRP method) may be set as the net doping concentration. The carrier concentration measured by the CV method or the SRP method may be a value in a thermal equilibrium state. In addition, in a region of the N type, the donor concentration is sufficiently higher than the acceptor concentration, and thus the carrier concentration of the region may be set as the donor concentration. Similarly, in a region of the P type, the carrier concentration of the region may be set as the acceptor concentration. In the present specification, the doping concentration of the N type region may be referred to as the donor concentration, and the doping concentration of the P type region may be referred to as the acceptor concentration.

When a concentration distribution of the donor, acceptor, or net doping has a peak in a region, a value of the peak may be set as the concentration of the donor, acceptor, or net doping in the region. In a case where the concentration of the donor, acceptor or net doping is substantially uniform in a region, or the like, an average value of the concentration of the donor, acceptor or net doping in the region may be set as the concentration of the donor, acceptor or net doping. In the present specification, atoms/$cm^3$ or /$cm^3$ is used to indicate a concentration per unit volume. This unit is used for the donor or acceptor concentration, or the chemical concentration in the semiconductor substrate. A notation of atoms may be omitted.

The carrier concentration measured by the SRP method may be lower than the concentration of the donor or the acceptor. In a range where a current flows when a spreading resistance is measured, carrier mobility of the semiconductor substrate may be lower than a value in a crystalline state. The decrease in carrier mobility occurs when carriers are scattered due to disorder (disorder) of a crystal structure due to a lattice defect or the like.

The concentration of the donor or the acceptor calculated from the carrier concentration measured by the CV method or the SRP method may be lower than a chemical concentration of an element indicating the donor or the acceptor. As an example, in a silicon semiconductor, a donor concentration of phosphorous or arsenic serving as a donor, or an acceptor concentration of boron (boron) serving as an acceptor is approximately 99% of chemical concentrations of these. On the other hand, in the silicon semiconductor, a donor concentration of hydrogen serving as a donor is approximately 0.1% to 10% of a chemical concentration of hydrogen.

FIG. 1 illustrates a top view showing an example of the semiconductor device 100 according to one embodiment of the present invention. FIG. 1 shows a position at which each member is projected on an upper surface of a semiconductor substrate 10. FIG. 1 shows merely some members of the semiconductor device 100, and omits illustrations of some members.

The semiconductor device 100 includes the semiconductor substrate 10. The semiconductor substrate 10 is a substrate that is formed of a semiconductor material. As an example, the semiconductor substrate 10 is a silicon substrate. The semiconductor substrate 10 has an end side 162 in a top view. When simply referred to as the top view in the present specification, it means that the semiconductor substrate 10 is viewed from an upper surface side. The semiconductor substrate 10 in this example has two sets of end sides 162 opposite to each other in a top view. In FIG. 1, the X axis and the Y axis are parallel to any of the end sides 162. In addition, the Z axis is perpendicular to the upper surface of the semiconductor substrate 10.

The semiconductor substrate 10 is provided with an active portion 160. The active portion 160 is a region where a main current flows in the depth direction between the upper surface and a lower surface of the semiconductor substrate 10 when the semiconductor device 100 operates. An emitter electrode, which is an example of an upper-surface electrode, is provided above the active portion 160, but is omitted in FIG. 1. The active portion 160 may refer to a region which overlaps with the emitter electrode in a top view. In addition, a region sandwiched between active portions 160 in a top view may also be included in the active portion 160.

The active portion 160 is provided with a transistor portion 70 including a transistor element such as an Insulated Gate Bipolar Transistor (IGBT). The active portion 160 may further be provided with a diode portion 80 including a diode element such as a freewheeling diode (FWD). In the example shown in FIG. 1, transistor portions 70 and diode portions 80 are alternately arranged along a predetermined array direction (the X axis direction in this example) on the upper surface of the semiconductor substrate 10. In the present specification, an array direction may be referred to as a first direction. The semiconductor device 100 in this example is a reverse-conducting IGBT (RC-IGBT).

In FIG. 1, a region where each of the transistor portions 70 is arranged is indicated by a symbol "I", and a region where each of the diode portions 80 is arranged is indicated by a symbol "F". In the present specification, a direction perpendicular to the array direction in a top view may be referred to as an extending direction or a second direction (the Y axis direction in FIG. 1). Each of the transistor portions 70 and the diode portions 80 may have a longitudinal length in the extending direction. That is, the length of each of the transistor portions 70 in the Y axis direction is larger than the width in the X axis direction. Similarly, the length of each of the diode portions 80 in the Y axis direction is larger than the width in the X axis direction. The extending direction of the transistor portion 70 and the diode portion 80, and the longitudinal direction of each trench portion described below may be the same.

Each of the diode portions 80 includes a cathode region of N+ type in a region in contact with the lower surface of the semiconductor substrate 10. In the present specification, a region where the cathode region is provided is referred to as the diode portion 80. That is, the diode portion 80 is a region that overlaps with the cathode region in a top view. On the lower surface of the semiconductor substrate 10, a collector region of the P+ type may be provided in a region other than the cathode region. In the present specification, the diode portion 80 may also include an extension region 81 where the diode portion 80 extends to a gate runner described below in the Y axis direction. The collector region is provided on a lower surface of the extension region 81.

The transistor portion 70 has the collector region of the P+ type in a region in contact with the lower surface of the semiconductor substrate 10. In addition, in the transistor portion 70, an emitter region of the N type, a base region of the P type, and a gate structure having a gate conductive portion and a gate dielectric film are periodically arranged on the upper surface side of the semiconductor substrate 10.

The semiconductor device 100 may have one or more pads above the semiconductor substrate 10. The semiconductor device 100 in this example has a gate pad 164. The semiconductor device 100 may have a pad such as an anode pad, a cathode pad, and a current detection pad. Each pad is arranged in the vicinity of the end side 162. The vicinity of the end side 162 refers to a region between the end side 162 and the emitter electrode in a top view. When the semiconductor device 100 is mounted, each pad may be connected to an external circuit via a wiring line such as a wire.

A gate potential is applied to the gate pad 164. The gate pad 164 is electrically connected to a conductive portion of a gate trench portion of the active portion 160. The semiconductor device 100 includes a gate runner 130 that connects the gate pad 164 and the gate trench portion. In FIG. 1, the gate runner 130 is hatched with diagonal lines.

The gate runner 130 in this example is arranged between the active portion 160 and the end side 162 of the semiconductor substrate 10 in a top view. The gate runner 130 in this example encloses the active portion 160 in a top view. A region enclosed by the gate runner 130 in a top view may be the active portion 160. In addition, a well region is formed below the gate runner. The well region is a P type region having a higher concentration than the base region described below, and is formed from the upper surface of the semiconductor substrate 10 to a position deeper than that of the base region. A region enclosed by the well region in a top view may be the active portion 160.

The gate runner 130 is connected to the gate pad 164. The gate runner 130 is arranged above the semiconductor substrate 10. The gate runner 130 may be a metal wiring line containing aluminum or the like, may be a wiring line formed of a semiconductor such as polysilicon doped with an impurity, or may have a structure in which these wiring lines are stacked. The gate runner 130 is connected to the gate trench portion of the active portion 160. The gate runner 130 may also be provided in the active portion 160.

In addition, the semiconductor device 100 may include a temperature sensing portion (not shown) that is a PN junction diode formed of polysilicon or the like, and a current detection portion (not shown) that simulates an operation of the transistor portion provided in the active portion 160.

The semiconductor device 100 in this example includes an edge termination structure portion 90 between the active portion 160 and the end side 162 in a top view. The edge termination structure portion 90 in this example is arranged between the gate runner 130 and the end side 162. The edge termination structure portion 90 reduces an electric field strength on the upper surface side of the semiconductor substrate 10. The edge termination structure portion 90 may include at least one of a guard ring, a field plate, and a RESURF which are annularly provided to enclose the active portion 160.

Figure 2:
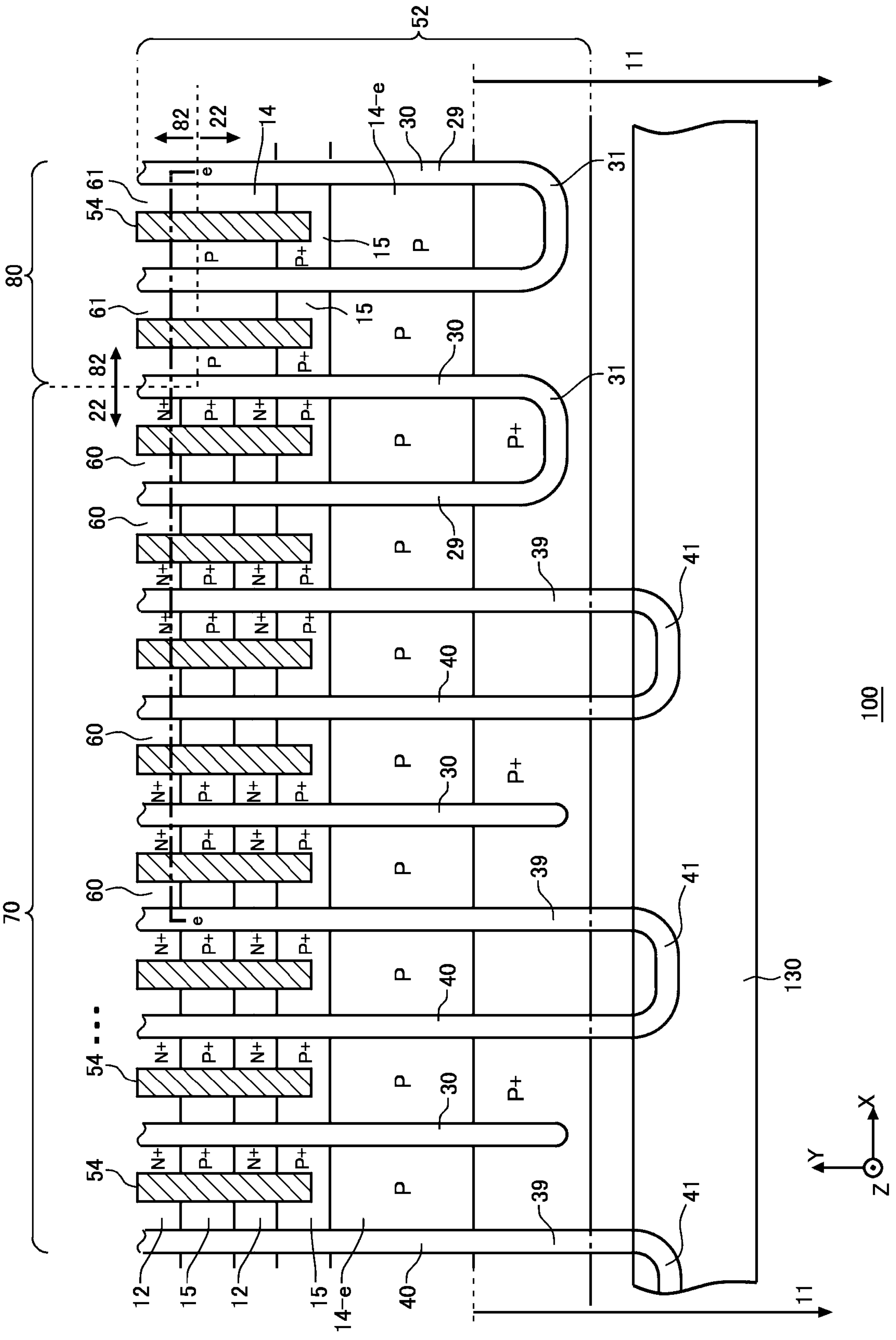
FIG. 2 illustrates an enlarged view of a region D in FIG. 1.

FIG. 2 illustrates an enlarged view of a region D in FIG. 1. The region D is a region including the transistor portion 70, the diode portion 80, and the gate runner 130. The semiconductor device 100 in this example includes a gate trench portion 40, a dummy trench portion 30, a well region 11, an emitter region 12, a base region 14, and a contact region 15 which are provided inside the upper surface side of the semiconductor substrate 10. The gate trench portion 40 and the dummy trench portion 30 each are an example of the trench portion. In addition, the semiconductor device 100 in this example includes an emitter electrode 52 and the gate runner 130 that are provided above the upper surface of the semiconductor substrate 10. The emitter electrode 52 and the gate runner 130 are provided separately from each other.

An interlayer dielectric film is provided between the emitter electrode 52 and the gate runner 130, and the upper surface of the semiconductor substrate 10, but the interlayer dielectric film is omitted in FIG. 2. In the interlayer dielectric film in this example, a contact hole 54 is provided passing through the interlayer dielectric film. In FIG. 2, each contact hole 54 is hatched with the diagonal lines.

The emitter electrode 52 is provided above the gate trench portion 40, the dummy trench portion 30, the well region 11, the emitter region 12, the base region 14, and the contact region 15. The emitter electrode 52 is in contact with the emitter region 12, the contact region 15, and the base region 14 on the upper surface of the semiconductor substrate 10, through the contact hole 54. In addition, the emitter electrode 52 is connected to a dummy conductive portion in the dummy trench portion 30 through the contact hole provided in the interlayer dielectric film. The emitter electrode 52 may be connected to the dummy conductive portion of the dummy trench portion 30 at an edge of the dummy trench portion 30 in the Y axis direction. The dummy conductive portion of the dummy trench portion 30 may not be connected to the emitter electrode 52 and the gate conductive portion, and may be controlled to be at a potential different from a potential of the emitter electrode 52 and a potential of the gate conductive portion.

The gate runner 130 is connected to the gate trench portion 40 through the contact hole provided in the interlayer dielectric film. The gate runner 130 may be connected to a gate conductive portion of the gate trench portion 40 at an edge portion 41 of the gate trench portion 40 in the Y axis direction. The gate runner 130 is not connected to the dummy conductive portion in the dummy trench portion 30.

The emitter electrode 52 is formed of a material containing a metal. FIG. 2 shows a range where the emitter electrode 52 is provided. For example, at least partial region of the emitter electrode 52 is formed of aluminum or an aluminum-silicon alloy, for example, a metal alloy such as AlSi, AlSiCu. The emitter electrode 52 may have a barrier metal formed of titanium, a titanium compound, or the like below a region formed of aluminum or the like. In addition, a plug, which is formed by embedding tungsten or the like so as to be in contact with the barrier metal and aluminum or the like, may be included in the contact hole.

The well region 11 is provided overlapping the gate runner 130. The well region 11 is provided so as to extend with a predetermined width even in a range not overlapping the gate runner 130. The well region 11 in this example is provided away from an end of the contact hole 54 in the Y axis direction toward the gate runner 130 side. The well region 11 is a second conductivity type region where the doping concentration is higher than the base region 14. The base region 14 in this example is the P type, and the well region 11 is the P+ type.

Each of the transistor portion 70 and the diode portion 80 includes a plurality of trench portions arranged in the array direction. In the transistor portion 70 in this example, one or more gate trench portions 40 and one or more dummy trench portions 30 are alternately provided along the array direction. In the diode portion 80 in this example, the plurality of dummy trench portions 30 are provided along the array direction. In the diode portion 80 in this example, the gate trench portion 40 is not provided.

The gate trench portion 40 in this example may have two linear portions 39 extending along the extending direction perpendicular to the array direction (portions of a trench that are linear along the extending direction), and the edge portion 41 connecting the two linear portions 39. The extending direction in FIG. 2 is the Y axis direction.

At least a part of the edge portion 41 is preferably provided in a curved shape in a top view. By connecting between end portions of the two linear portions 39 in the Y axis direction by the edge portion 41, it is possible to reduce the electric field strength at the end portions of the linear portions 39.

In the transistor portion 70, the dummy trench portions 30 are provided between the respective linear portions 39 of the gate trench portions 40. Between the respective linear portions 39, one dummy trench portion 30 may be provided or a plurality of dummy trench portions 30 may be provided. The dummy trench portion 30 may have a linear shape extending in the extending direction, or may have linear portions 29 and an edge portion 31 similarly to the gate trench portion 40. The semiconductor device 100 shown in FIG. 2 includes both of the linear dummy trench portion 30 having no edge portion 31, and the dummy trench portion 30 having the edge portion 31.

A diffusion depth of the well region 11 may be deeper than the depth of the gate trench portion 40 and the dummy trench portion 30. The end portions in the Y axis direction of the gate trench portion 40 and the dummy trench portion 30 are provided in the well region 11 in a top view. That is, the bottom in the depth direction of each trench portion is covered with the well region 11 at the end portion in the Y axis direction of each trench portion. With this configuration, the electric field strength on the bottom portion of each trench portion can be reduced.

A mesa portion is provided between the respective trench portions in the array direction. The mesa portion refers to a region sandwiched between two trench portions inside the semiconductor substrate 10. As an example, an upper end of the mesa portion is the upper surface of the semiconductor substrate 10. The depth position of the lower end of the mesa portion is the same as the depth position of the lower end of the trench portion. The mesa portion in this example is provided extending in the extending direction (the Y axis direction) along the trench, on the upper surface of the semiconductor substrate 10. In this example, a mesa portion 60 is provided in the transistor portion 70, and a mesa portion 61 is provided in the diode portion 80. In the case of simply mentioning "mesa portion" in the present specification, the portion refers to each of the mesa portion 60 and the mesa portion 61.

Each mesa portion is provided with the base region 14. In the mesa portion, a region arranged closest to the gate runner 130, in the base region 14 exposed on the upper surface of the semiconductor substrate 10, is to be a base region 14-*e*. While FIG. 2 shows the base region 14-*e* arranged at one end portion of each mesa portion in the extending direction, the base region 14-*e* is also arranged at the other end portion of each mesa portion. Each mesa portion may be provided with at least one of a first conductivity type of emitter region 12, and a second conductivity type of contact region 15 in a region sandwiched between the base regions 14-*e* in a top view. The emitter region 12 in this example is the N+ type, and the contact region 15 is the P+ type. The emitter region 12 and the contact region 15 may be provided between the base region 14 and the upper surface of the semiconductor substrate 10 in the depth direction.

The mesa portion 60 of the transistor portion 70 has the emitter region 12 in contact with the upper surface of the semiconductor substrate 10 (that is, exposed on the upper surface). The emitter region 12 is provided in contact with the gate trench portion 40. The mesa portion 60 in contact with the gate trench portion 40 may be provided with the contact region 15 exposed on the upper surface of the semiconductor substrate 10.

Each of the contact region 15 and the emitter region 12 in the mesa portion 60 is provided from one trench portion to the other trench portion in the X axis direction. As an example, the contact region 15 and the emitter region 12 in the mesa portion 60 are alternately arranged along the extending direction of the trench portion (the Y axis direction).

In another example, the contact region 15 and the emitter region 12 in the mesa portion 60 may be provided in a stripe shape along the extending direction of the trench portion (the Y axis direction). For example, the emitter region 12 is provided in a region in contact with the trench portion, and the contact region 15 is provided in a region sandwiched between the emitter regions 12.

The mesa portion 61 of the diode portion 80 is not provided with the emitter region 12. The base region 14 and the contact region 15 may be provided on an upper surface of the mesa portion 61. In the region sandwiched between the base regions 14-*e* on the upper surface of the mesa portion 61, the contact region 15 may be provided in contact with each base region 14-*e*. The base region 14 may be provided in a region sandwiched between the contact regions 15 on the upper surface of the mesa portion 61. The base region 14 may be arranged in the entire region sandwiched between the contact regions 15.

The contact hole 54 is provided above each mesa portion. The contact hole 54 is arranged in the region sandwiched between the base regions 14-*e*. The contact hole 54 in this example is provided above each of the contact region 15, the base region 14, and the emitter region 12. The contact hole 54 is not provided in regions corresponding to the base region 14-*e* and the well region 11. The contact hole 54 may be arranged at the center of the mesa portion 60 in the array direction (the X axis direction).

In the diode portion 80, a cathode region 82 of the N+ type is provided in a region in direct contact with the lower surface of the semiconductor substrate 10. On the lower surface of the semiconductor substrate 10, an active collector region of the P+ type 22 may be provided in a region where the cathode region 82 is not provided. The cathode region 82 and the active collector region 22 are provided between a lower surface 23 of the semiconductor substrate 10 and a buffer region 20. In FIG. 2, a boundary between the cathode region 82 and the active collector region 22 is indicated by a dotted line.

The cathode region 82 is arranged away from the well region 11 in the Y axis direction. With this configuration, the distance between the P type region (the well region 11) having a relatively high doping concentration and formed up to the deep position, and the cathode region 82 is ensured, so that the breakdown voltage can be improved. The end portion in the Y axis direction of the cathode region 82 in this example is arranged farther away from the well region 11 than the end portion in the Y axis direction of the contact hole 54. In another example, the end portion in the Y axis direction of the cathode region 82 may be arranged between the well region 11 and the contact hole 54.

Figure 3:
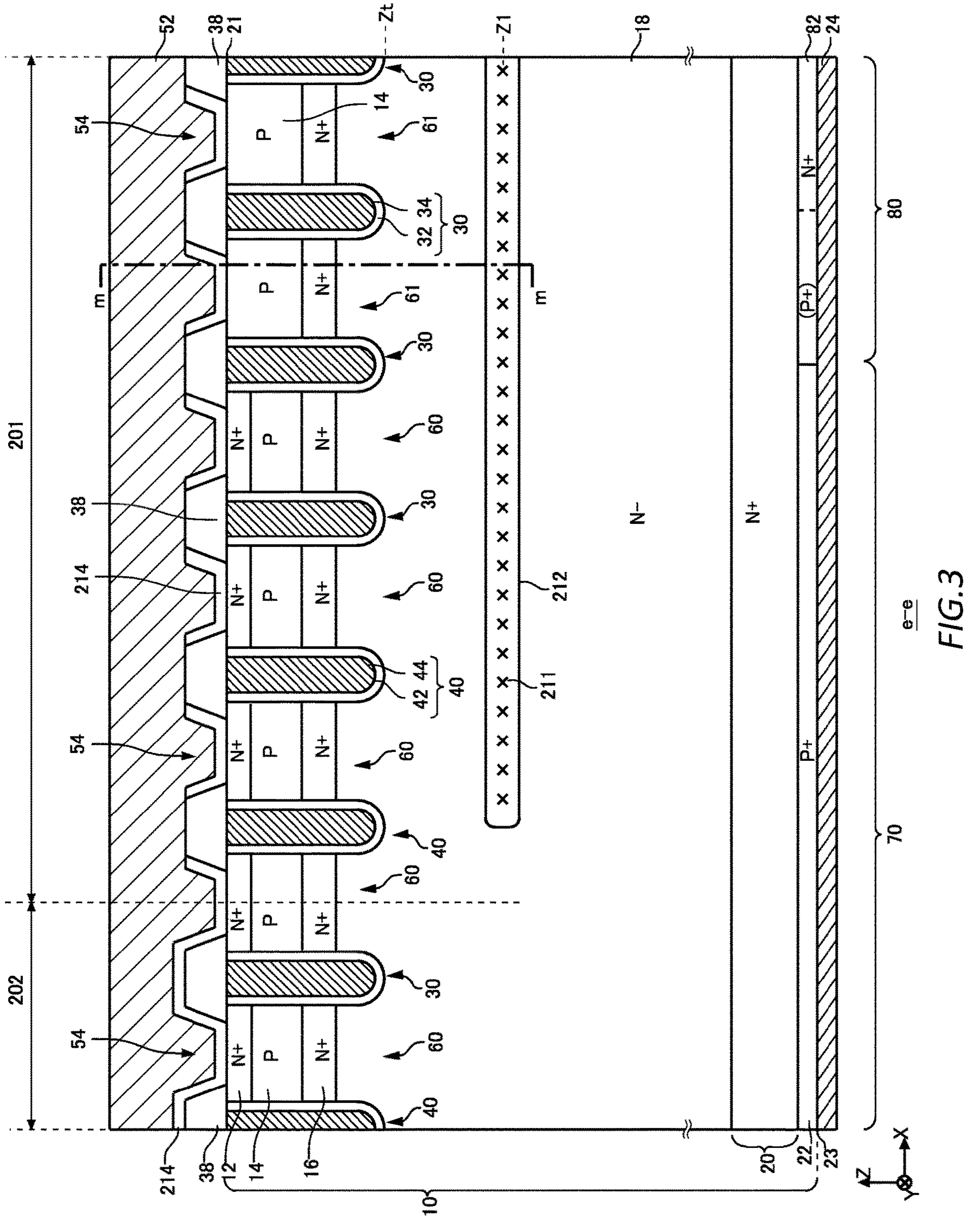
FIG. 3 illustrates an example of a cross section e-e in FIG. 2.

FIG. 3 illustrates an example of a cross section e-e in FIG. 2. The cross section e-e is an XZ plane passing through the emitter region 12 and the cathode region 82. The semiconductor device 100 in this example includes the semiconductor substrate 10, the interlayer dielectric film 38, the emitter electrode 52, and the collector electrode 24 in the cross section.

The interlayer dielectric film 38 is provided on the upper surface of the semiconductor substrate 10. The interlayer dielectric film 38 is a film including at least one layer of a dielectric film such as silicate glass to which an impurity such as boron or phosphorous is added, a thermal oxide film, and other dielectric films. The interlayer dielectric film 38 is provided with the contact hole 54 described in FIG. 2.

The emitter electrode 52 is provided above the interlayer dielectric film 38. The emitter electrode 52 is in contact with an upper surface 21 of the semiconductor substrate 10 through the contact hole 54 of the interlayer dielectric film 38. The collector electrode 24 is provided on the lower surface 23 of the semiconductor substrate 10. The emitter electrode 52 and the collector electrode 24 are formed of a metal material such as aluminum. In the present specification, the direction in which the emitter electrode 52 is connected to the collector electrode 24 (the Z axis direction) is referred to as the depth direction.

The semiconductor substrate 10 includes a drift region 18 of the N type or the N− type. The drift region 18 is provided in each of the transistor portion 70 and the diode portion 80.

In the mesa portion 60 of the transistor portion 70, the emitter region 12 of the N+ type and the base region 14 of the P type are provided in order from an upper surface 21 side of the semiconductor substrate 10. The drift region 18 is provided below the base region 14. The mesa portion 60 may be provided with an accumulation region 16 of the N+ type. The accumulation region 16 is arranged between the base region 14 and the drift region 18. The accumulation region 16 is a region of the N+ type having a higher doping concentration than the drift region 18. Providing the accumulation region 16 having a high concentration between the drift region 18 and the base region 14 can improve a carrier injection enhancement effect (IE effect) and reduce an on-voltage. The accumulation region 16 may be provided to cover the entire lower surface of the base region 14 in each mesa portion 60. The accumulation region 16 may be or may not be provided in each mesa portion 61 of the diode portion 80.

The emitter region 12 is exposed on the upper surface 21 of the semiconductor substrate 10 and is provided in contact with gate trench portion 40. The emitter region 12 may be in contact with the trench portions on both sides of the mesa portion 60. The emitter region 12 has a higher doping concentration than the drift region 18.

The base region 14 is provided below the emitter region 12. The base region 14 in this example is provided in contact with the emitter region 12. The base region 14 may be in contact with the trench portions on both sides of the mesa portion 60.

The mesa portion 61 of the diode portion 80 is provided with the base region 14 of the P type in contact with the upper surface 21 of the semiconductor substrate 10. The drift region 18 is provided below the base region 14. The base region 14 of the diode portion 80 may be referred to as an anode region. The base region 14 of the diode portion 80 may have the same doping concentration as or a doping concentration different from that of the base region 14 of the transistor portion 70. For example, the doping concentration of the base region 14 of the diode portion 80 may be lower than the doping concentration of the base region 14 of the transistor portion 70.

In each of the transistor portion 70 and the diode portion 80, a buffer region 20 of the N+ type may be provided below the drift region 18. The doping concentration of the buffer region 20 is higher than the doping concentration of the drift region 18. The buffer region 20 may have a concentration peak having a higher doping concentration than the doping concentration of the drift region 18. The doping concentration of the concentration peak indicates a doping concentration at the local maximum of the concentration peak. In addition, as the doping concentration of the drift region 18, an average value of doping concentrations in the region where the doping concentration distribution is substantially flat may be used.

The buffer region 20 may have two or more concentration peaks in the depth direction (the Z axis direction) of the semiconductor substrate 10. The concentration peak of the buffer region 20 may be provided at the same depth position as, for example, that of a chemical concentration peak of hydrogen (proton) or phosphorous. The buffer region 20 may function as a field stop layer which prevents a depletion layer expanding from the lower end of the base region 14 from reaching the active collector region 22 of the P+ type and the cathode region 82 of the N+ type.

In the transistor portion 70, the active collector region 22 of the P+ type is provided between the lower surface 23 of the semiconductor substrate 10 and the drift region 18. The active collector region 22 in this example is provided in contact with the buffer region 20 and the lower surface 23 of the semiconductor substrate 10. A maximum value of an acceptor concentration of the active collector region 22 is higher than a maximum value of an acceptor concentration of the base region 14. The active collector region 22 may contain the same acceptor as or an acceptor different from that of the base region 14. The acceptor of the active collector region 22 is, for example, boron.

Below the buffer region 20 in the diode portion 80, the cathode region 82 of the N+ type is provided. A donor concentration of the cathode region 82 is higher than a donor concentration of the drift region 18. A donor of the cathode region 82 is, for example, hydrogen or phosphorous. It should be noted that an element serving as a donor and an acceptor in each region is not limited to the example described above. The active collector region 22 and the cathode region 82 are exposed on the lower surface 23 of the semiconductor substrate 10 and are connected to the collector electrode 24. The collector electrode 24 may be in contact with the entire lower surface 23 of the semiconductor substrate 10. The emitter electrode 52 and the collector electrode 24 are formed of a metal material such as aluminum.

One or more gate trench portions 40 and one or more dummy trench portions 30 are provided on the upper surface 21 side of the semiconductor substrate 10. Each trench portion passes through the base region 14 from the upper surface 21 of the semiconductor substrate 10, and reaches below the base region 14. In a region where at least any one of the emitter region 12, the contact region 15, and the accumulation region is provided, each trench portion also passes through these doping regions. The configuration of the trench portion passing through the doping region is not limited to the one manufactured in the order of forming the doping region and then forming the trench portion. The configuration of the trench portion passing through the doping region includes a configuration of the doping region being formed between the trench portions after forming the trench portion.

As described above, the transistor portion 70 is provided with the gate trench portion 40 and the dummy trench portion 30. In the diode portion 80, the dummy trench portion 30 is provided, and the gate trench portion 40 is not provided. The boundary in the X axis direction between the diode portion 80 and the transistor portion 70 in this example is the boundary between the cathode region 82 and the active collector region 22.

The gate trench portion 40 includes a gate trench provided in the upper surface 21 of the semiconductor substrate 10, a gate dielectric film 42, and a gate conductive portion 44. The gate dielectric film 42 is provided to cover the inner wall of the gate trench. The gate dielectric film 42 may be formed by oxidizing or nitriding a semiconductor on the inner wall of the gate trench. The gate conductive portion 44 is provided farther inward than the gate dielectric film 42 inside the gate trench. That is, the gate dielectric film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered by the interlayer dielectric film 38 on the upper surface 21 of the semiconductor substrate 10. The gate conductive portion 44 is electrically connected to the gate runner. When a predetermined gate voltage is applied to the gate conductive portion 44, a channel is formed by an electron inversion layer in a surface layer of the base region 14 at a boundary in contact with the gate trench portion 40.

The dummy trench portions 30 may have the same structure as the gate trench portions 40 in the cross section. The dummy trench portion 30 includes a dummy trench provided in the upper surface 21 of the semiconductor substrate 10, a dummy dielectric film 32, and a dummy conductive portion 34. The dummy conductive portion 34 is electrically connected to the emitter electrode 52. The dummy dielectric film 32 is provided covering an inner wall of the dummy trench. The dummy conductive portion 34 is provided inside the dummy trench, and is provided farther inward than the dummy dielectric film 32. The dummy dielectric film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon or the like. The dummy conductive portion 34 may have the same length as the gate conductive portion 44 in the depth direction.

The gate trench portion 40 and the dummy trench portion 30 in this example are covered with the interlayer dielectric film 38 on the upper surface 21 of the semiconductor substrate 10. It should be noted that the bottoms of the dummy trench portion 30 and the gate trench portion 40 may be formed in a curved-surface shape (a curved shape in the cross section) convexly downward. In the present specification, a depth position of the lower end of the gate trench portion 40 is referred to as Zt.

The semiconductor device 100 in this example includes a lifetime control region 212 including lattice defects 211 which adjusts a lifetime of carriers. The lifetime control region 212 in this example is a region where a lifetime of charge carriers is locally short. The charge carriers are electrons or holes. The charge carriers may be simply referred to as the carriers.

Implanting charged particles such as helium into the semiconductor substrate 10 forms the lattice defects 211 such as vacancies in the vicinity of an implantation position. The lattice defects 211 generate recombination centers. The lattice defects 211 may be mainly composed of vacancies such as monatomic vacancies (V) or diatomic vacancies (VV), may be dislocations, may be interstitial atoms, or may be transition metals or the like. For example, atoms adjacent to the vacancies have dangling bonds. In a broad sense, the lattice defects 211 may also include donors and acceptors, but in the present specification, the lattice defects 211 mainly composed of vacancies may be referred to as vacancy-type lattice defects, vacancy-type defects, or simply lattice defects. In the present specification, the lattice defects 211 may be simply referred to as recombination centers or lifetime killers as recombination centers contributing to recombination of carriers. The lifetime killers may be formed by implanting helium ions into the semiconductor substrate 10. In this case, a helium chemical concentration may be used as a density of the lattice defects 211. It should be noted that, since the lifetime killers formed by implanting helium may be terminated by hydrogen present in the buffer region 20, a depth position of a density peak of the lifetime killers may not match a depth position of a helium chemical concentration peak. Alternatively, when hydrogen ions are implanted into the semiconductor substrate 10, the lifetime killers may be formed in a hydrogen ion pass through region on an implantation surface side with respect to a projected range.

In FIG. 3, the lattice defects 211 at the implantation position of the charged particles are schematically indicated by X marks. In a region where many lattice defects 211 remain, the carriers are captured by the lattice defects 211, which thus shortens the lifetime of the carriers. Adjusting the lifetime of the carriers can adjust characteristics such as a reverse recovery time and a reverse recovery loss of a region which operates as a diode in the vicinity of the lifetime control region 212. In the depth direction of the semiconductor substrate 10, a position where the carrier lifetime has a local minimum value may be a depth Z1 at which the lifetime control region 212 is provided.

The lifetime control region 212 is arranged at the depth Z1 on the upper surface 21 side of the semiconductor substrate 10. The upper surface 21 side is a region from a central position of the semiconductor substrate 10 in the depth direction to the upper surface 21 of the semiconductor substrate 10. The lifetime control region 212 in this example is arranged below the position Zt of the lower end of the trench portion.

The lifetime control region 212 includes the lattice defects 211 with a predetermined first defect density. A defect density corresponds to the number of lattice defects per unit volume. As described above, a chemical concentration (atoms/$cm^3$) of an impurity such as helium may be used as a value indicating the defect density. In another example, a reciprocal of a lifetime of minority carriers may be used as a value indicating the defect density. A local maximum value of the density of the lattice defects 211 in the depth direction may be treated as the defect density in the lifetime control region 212. A position where the defect density in the depth direction has the local maximum value may be a first depth Z1 at which the lifetime control region 212 is provided.

The lifetime control region 212 is provided in a predetermined range in a top view. The lifetime control region 212 in this example is provided in the entire diode portion 80 in the X axis direction. In addition, the lifetime control region 212 in this example is provided in a region in contact with the diode portion 80 in the X axis direction, in at least part of the transistor portion 70.

The lifetime control region 212 has a first defect density at each position in a top view. However, the defect density at each position in a top view of the lifetime control region 212 may have a predetermined error from each other. The error is, for example, within ±20%. For example, with respect to a maximum value of the defect density in the lifetime control region 212, a region exhibiting the defect density of 60% or more may be the lifetime control region 212, a region exhibiting the defect density of 80% or more may be the lifetime control region 212, or a region exhibiting the defect density of 90% or more may be the lifetime control region 212. The semiconductor device 100 may also include the lifetime control region 212 on a lower surface 23 side of the semiconductor substrate 10. The lifetime control region 212 on the lower surface 23 side may be provided in the entire diode portion 80 and transistor portion 70 in the X axis direction.

The semiconductor device 100 includes a barrier metal 214 which contains a metal having a higher melting point than a material of the semiconductor substrate 10 (silicon in this example) A melting point of silicon is 1410 degrees C. Examples of the metal having the higher melting point than the material of the semiconductor substrate 10 (silicon) include, but are not limited to, titanium, molybdenum, tungsten, hafnium, vanadium, palladium, zirconium, niobium, nickel, cobalt, and platinum. The barrier metal 214 containing the metal having the higher melting point than the material of the semiconductor substrate 10 (silicon) offers such advantages that the metal is hardly diffused into the semiconductor substrate 10 during heat treatment and that contact between the metal and the semiconductor is stabilized. The barrier metal 214 may include at least one of a titanium film or a titanium nitride film. A silicide layer containing the metal of the barrier metal 214 may be provided between the barrier metal 214 and the semiconductor substrate 10. The barrier metal 214 may be a laminated film of the titanium film and the titanium nitride film. The barrier metal 214 is arranged between the semiconductor substrate 10 and the emitter electrode 52. The emitter electrode 52 is a metal electrode which does not contain the metal having the higher melting point than silicon. As an example, the emitter electrode 52 is an electrode containing an Al—Si alloy. The barrier metal 214 in this example is provided between the interlayer dielectric film 38 and the emitter electrode 52. The barrier metal 214 may be in contact with the interlayer dielectric film 38. In a region where the contact hole 54 is provided in the interlayer dielectric film 38, the barrier metal 214 may be in contact with the upper surface 21 of the semiconductor substrate 10. The barrier metal 214 may also be provided on side surfaces of the interlayer dielectric film 38 in the contact hole 54.

A deficit or a gap may be generated due to stress migration, inside the emitter electrode 52. For example, when a protective film such as polyimide is provided on an upper surface of the emitter electrode 52, remaining stress such as during formation of the protective film is applied to the emitter electrode 52. From the influence of the stress, the deficit or the gap may be generated inside the emitter electrode 52.

The deficit or the gap generated inside the emitter electrode 52 increases a possibility of penetration of ions such as resin ions into the semiconductor substrate 10 via the deficit or the gap. The penetration of the ions into the semiconductor substrate 10 may trap the ions in gate oxide films (the gate dielectric film 42 and the dummy dielectric film 32) of the trench portion, and cause a variation in characteristics such as a decrease in a threshold voltage of the semiconductor device 100. In contrast, providing the barrier metal 214 can prevent the penetration of the ions into the semiconductor substrate 10.

On the other hand, lattice defects or the like inside the semiconductor substrate 10 may be terminated by annealing the semiconductor substrate 10 in a hydrogen atmosphere. For example, radiating the charged particles such as helium from the upper surface 21 of the semiconductor substrate 10 in order to form the lifetime control region 212, forms lattice defects, fixed charges, or the like caused by collisions between the charged particles and semiconductor atoms constituting the semiconductor substrate 10, in the base region 14, the gate oxide films of the trench portion, or the like through which the charged particles have passed. The formation of the lattice defects in the base region 14 or the like decreases a threshold voltage Vth at which the transistor portion 70 is turned on. In contrast, the decrease in the threshold voltage Vth can be suppressed by annealing the semiconductor substrate 10 in the hydrogen atmosphere to recover the lattice defects formed in the base region 14 or the like. However, since the barrier metal 214 has a property of absorbing hydrogen, hydrogen annealing cannot sufficiently reduce the lattice defects, the fixed charges, or the like in a region provided with the barrier metal 214.

The semiconductor device 100 in this example includes a first region 201 and a second region 202. In the first region 201, the barrier metal 214 is not provided between the trench portion and the emitter electrode 52, and the barrier metal 214 is provided between the mesa portion in contact with the trench portion not provided with the barrier metal 214 and the emitter electrode 52. In the first region 201 in this example, the interlayer dielectric film 38 above the trench portion and the emitter electrode 52 are in contact with each other. In the first region 201, the interlayer dielectric film 38 forming a side wall of the contact hole 54 may be or may not be partially or entirely covered with the barrier metal 214. In addition, the barrier metal 214 is in contact with the upper surface 21 of the semiconductor substrate 10 in the mesa portion. The entire mesa portion in the X axis direction may be covered with the barrier metal 214.

In the second region 202, the barrier metal 214 is provided between the trench portion and the emitter electrode 52. In the second region 202, the barrier metal 214 may be or may not be provided between the mesa portion in contact with the trench portion provided with the barrier metal 214 and the emitter electrode 52. In the second region 202 in this example, the barrier metal 214 is provided between the interlayer dielectric film 38 above the trench portion and the emitter electrode 52. In the second region 202, the entire interlayer dielectric film 38 in the X axis direction may be covered with the barrier metal 214. In the second region 202, the entire interlayer dielectric film 38 forming the side wall of the contact hole 54 may be covered with the barrier metal 214. In addition, the barrier metal 214 is in contact with the upper surface 21 of the semiconductor substrate 10 in the mesa portion. The entire mesa portion in the X axis direction may be covered with the barrier metal 214.

The fact that the barrier metal 214 is provided between the trench portion and the emitter electrode 52 refers to a state in which the entire trench portion in the X axis direction is covered with the barrier metal 214. In addition, the fact that the barrier metal 214 is not provided between the trench portion and the emitter electrode 52 refers to a state in which at least part of the trench portion in the X axis direction is not covered with the barrier metal 214. For example, when a center of the trench portion in the X axis direction is not covered with the barrier metal 214, it may be considered that the barrier metal 214 is not provided between the trench portion and the emitter electrode 52. In addition, a state in which a region equivalent to half or more of the trench portion in the X axis direction is not covered with the barrier metal 214 may be a state in which the barrier metal 214 is not provided between the trench portion and the emitter electrode 52. In the Y axis direction, the barrier metal 214 may be provided in a range wider than, in the same range as, or in a range narrower than the trench portion.

In the first region 201, at least part of the trench portion is not covered with the barrier metal 214, which thus makes it easy to reduce the lattice defects or the fixed charges in the semiconductor substrate 10. Not covering the trench portion with the barrier metal 214 makes it easy for hydrogen to penetrate into the semiconductor substrate 10 via the trench portion when the semiconductor substrate 10 is hydrogen annealed. Thus, it is possible to efficiently reduce the lattice defects or the fixed charges in the base region 14 or the like in contact with the trench portion. Since a channel is formed in the base region 14 in contact with the trench portion, reducing the lattice defects in the base region 14 and the ions (the fixed charges) in the gate oxide films of the trench portion can suppress the variation in the characteristics such as the decrease in the threshold voltage Vth. In addition, in the first region 201, an upper surface of the interlayer dielectric film 38 of the trench portion is not covered with the barrier metal 214, and an area of a boundary region where part of the base region 14 in contact with the trench portion functions as the channel is equal to or smaller than half of an area of the entire transistor portion 70. This configuration can reduce a probability of the penetration of the resin ions caused by the deficit of the emitter electrode 52.

In the second region 202, the trench portion is covered with the barrier metal 214, which thus makes it easy to suppress the penetration of the resin ions or the like into the semiconductor substrate 10.

Providing the first region 201 and the second region 202 described above mixed together can provide, in the semiconductor substrate 10, a region where priority is given to reducing the lattice defects or the fixed charges through the hydrogen annealing or the like and a region where priority is given to suppressing the penetration of the resin ions or the like. This configuration makes it easy to suppress the variation in the characteristics such as the decrease in the threshold voltage of the semiconductor device 100.

The first region 201 and the second region 202 may be provided in the active portion 160. This configuration can not only suppress the variation in the characteristics of the transistor portion 70 and the diode portion 80, but can also optimize the characteristics In the example shown in FIG. 3, the first region 201 is arranged closest to the diode portion 80 in the X axis direction, in the transistor portion 70. The first region 201 may be provided at a position in contact with the diode portion 80 in the X axis direction, in the transistor portion 70. The first region 201 may include one mesa portion 60 or two or more mesa portions 60 in the X axis direction. In the example shown in FIG. 3, the first region 201 is also provided in the diode portion 80. The entire diode portion 80 in the X axis direction may be the first region 201.

When the boundary region is provided between the transistor portion 70 and the diode portion 80, the first region 201 may be provided at a position in contact with the boundary region in the transistor portion 70. The boundary region is, for example, a region where a structure on the upper surface 21 side of the semiconductor substrate 10 is the same as that of the diode portion 80 and where a structure on the lower surface 23 side is the same as that of the transistor portion 70. The boundary region may be a region where the collector region 22 is provided at the lower surface 23 of the semiconductor substrate 10, where the base region 14 is provided at the upper surface 21 of the semiconductor substrate 10, and where the emitter region 12 and the gate trench portion 40 are not provided at the upper surface 21 of the semiconductor substrate 10. In this case, the entire boundary region in the X axis direction may be the first region 201. The collector region 22 may extend to the mesa portion 61 where the lifetime control region 212 is provided in a top view and where the emitter region 12 is not formed. As an example, the collector region 22 may extend with one mesa portion 61 as the boundary region as indicated by a dotted line. The collector region 22 may extend over a plurality of mesa portions 61. That is, the boundary region may be provided over the plurality of mesa portions 61.

The lifetime control region 212 may be provided in the first region 201 arranged in the transistor portion 70. The first region 201 may include the entire lifetime control region 212 in the transistor portion 70. The first region 201 may include a portion not provided with the lifetime control region 212. The trench portion above the lifetime control region 212 in the transistor portion 70 may not be covered with the barrier metal 214. This configuration makes it easy to reduce, through the hydrogen annealing, the lattice defects or the fixed charges generated when the lifetime control region 212 is formed.

In the cross section along the X axis and the Z axis of the first region 201 arranged in the transistor portion 70, a ratio of the number of gate trench portions 40 to the number of trench portions may be 70% or less, may be 50% or less, may be 30% or less, or may be 10% or less. The number of trench portions in the first region 201 may be a sum of the number of gate trench portions 40 and the number of dummy trench portions 30. In the first region 201 arranged in the transistor portion 70, a smaller ratio of the number of gate trench portions 40 can suppress a variation in the threshold voltage Vth. As the ratio of the number of gate trench portions 40 to the number of trench portions decreased, a range of the variation in the threshold voltage Vth decreased, and when the ratio of the number of gate trench portions 40 to the number of trench portions was 30% or less, the range of the variation in the threshold voltage Vth was minimum and substantially constant. The dummy trench portion 30 may have a potential different from a gate voltage. Therefore, a larger ratio of the number of dummy trench portions 30 in the first region 201 arranged in the transistor portion 70 reduces the range of the variation in the threshold voltage Vth. In the cross section along the X axis and the Z axis of the first region 201 arranged in the transistor portion 70, the number of gate trench portions 40 may be smaller than the number of dummy trench portions 30.

The lifetime control region 212 may be provided in the first region 201 arranged in the diode portion 80. The first region 201 may include the entire lifetime control region 212 in the diode portion 80. The trench portion above the lifetime control region 212 in the diode portion 80 may not be covered with the barrier metal 214. This configuration makes it easy to recover, through the hydrogen annealing, damage generated when the lifetime control region 212 is formed.

The second region 202 is arranged at a position farther away from the diode portion 80 than the first region 201, in the transistor portion 70. A distance between the second region 202 of the transistor portion 70 and the diode portion 80 in the X axis direction may be greater or smaller than a distance between the first region 201 of the transistor portion 70 and the diode portion 80 in the X axis direction. In this example, it is greater. The transistor portion 70 in this example includes first regions 201 at both ends in the X axis direction. In addition, in the transistor portion 70, the entire region sandwiched between the two first regions 201 at both ends is the second region 202. In this example, the lifetime control region 212 is not provided in the second region 202 arranged in the transistor portion 70. In this case, since the lattice defects or the fixed charges at the time of formation of the lifetime control region 212 are not formed in the second region 202, the barrier metal 214 may not be excluded for the hydrogen annealing. Covering the trench portion in the second region 202 with the barrier metal 214 can suppress the penetration of the resin ions or the like into the second region 202. In one transistor portion 70, a total width of the first region 201 in the X axis direction may be smaller than a total width of the second region 202.

Figure 4:
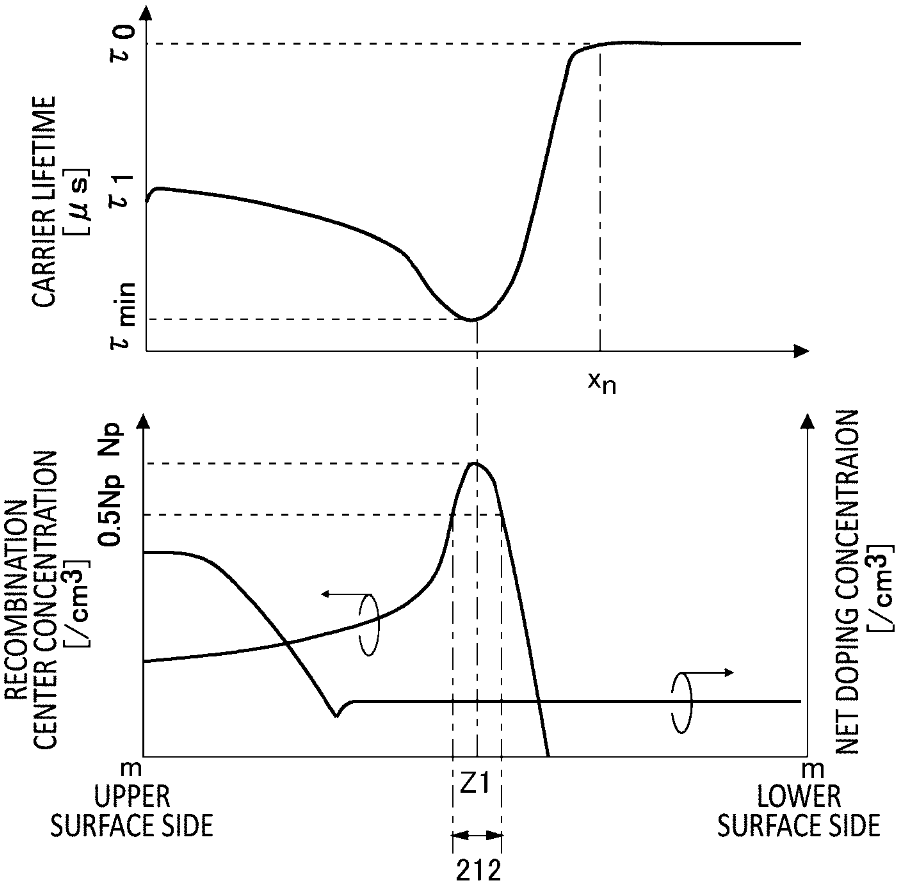
FIG. 4 shows a carrier lifetime distribution, a net doping concentration distribution, and a concentration distribution of recombination centers in a lifetime control region 212 in a Z axis direction, along a cross section m-m in FIG. 3.

FIG. 4 shows a carrier lifetime distribution, a net doping concentration distribution, and a concentration distribution of recombination centers in the lifetime control region 212 in the Z axis direction, along a cross section m-m in FIG. 3. The lifetime control region 212 in this example is formed by radiating helium ions from the upper surface 21 side of the semiconductor substrate 10.

A concentration of lifetime killers (recombination centers) in the lifetime control region 212 reaches a peak concentration Np at the first depth Z1. The depth position is arranged in the drift region 18 on the upper surface 21 side with respect to a center of the semiconductor substrate 10 in the depth direction. A region having the lifetime killers with a concentration higher than a half value 0.5 Np of the peak concentration Np may the lifetime control region 212.

When helium ions or the like are radiated from the upper surface 21 side, the lifetime killers with a concentration lower than the peak concentration Np are distributed with a tail in which the concentration gradually decreases, from the peak position Z1 to the upper surface 21 of the semiconductor substrate 10. On the other hand, the concentration of the lifetime killers on the lower surface 23 side of the semiconductor substrate 10 with respect to the peak position Z1 decreases more steeply than the concentration of the lifetime killers on the upper surface 21 side of the semiconductor substrate 10 with respect to the peak position Z1. The concentration distribution in the lifetime control region 212 may not reach the lower surface 23.

If the distribution has a continuous tail from the upper surface 21 to a position of the peak concentration Np, the depth position Z1 of the peak concentration Np may be on the lower surface 23 side with respect to an intermediate position of the semiconductor substrate 10 in the depth direction.

The concentration of the recombination centers shown in FIG. 4 may be a helium concentration as described above, or may be a crystal defect density formed through the helium radiation. Crystal defects may be interstitial helium, vacancies, divacancies or the like, or dangling bonds formed by the vacancies or the like. These crystal defects form the recombination centers of carriers. Recombination of the carriers is enhanced through energy levels (trap levels) of the formed recombination centers. A recombination center concentration corresponds to a trap level density.

The carrier lifetime distribution shown in FIG. 4 has a minimum value $\tau_{min}$ at a position approximately corresponding to the peak position Z1 of the recombination center concentration. In the base region 14 close to the upper surface 21, the carrier lifetime distribution may have a value $\tau_1$ greater than $\tau_{min}$. In a region where the lifetime killers are not introduced, the carrier lifetime distribution may have a substantially uniform value (assumed to be $\tau_0$). In this example, the carrier lifetime is $\tau_0$ in a region on the lower surface 23 side with respect to the depth position $x_n$. The depth position $x_n$ in this example is a position in the drift region 18 which is deeper than the depth position Z1. The value $\tau_0$ is greater than the value $\tau_1$. In a top view, in a region other than the lifetime control region 212, that is, another region where the lifetime killers are not introduced, a value of the carrier lifetime at the depth position Z1 may be $\tau_0$.

Figure 5:
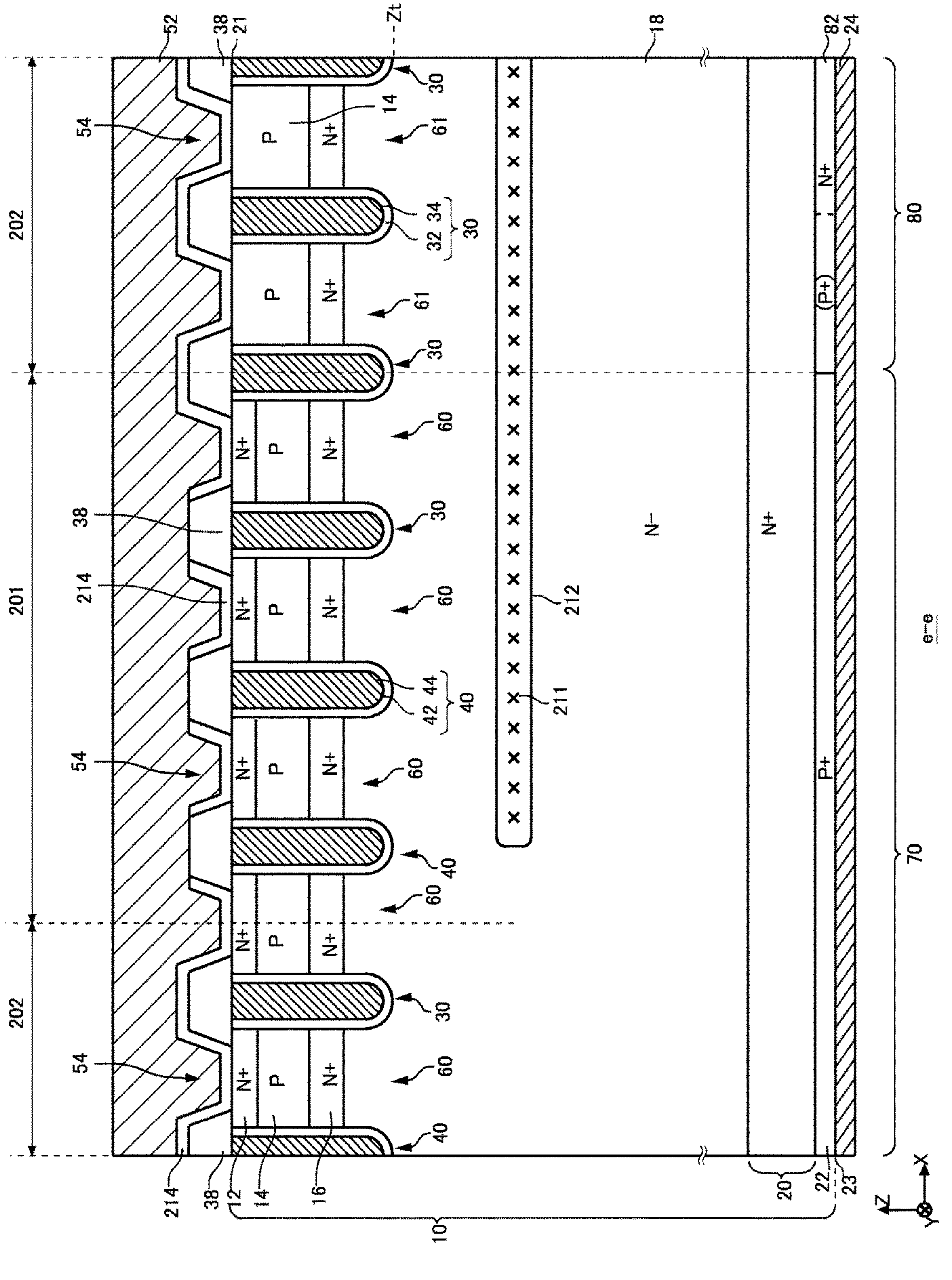
FIG. 5 illustrates another example of the cross section e-e.

FIG. 5 illustrates another example of the cross section e-e. The semiconductor device 100 in this example is different from that in the example described in FIG. 1 to FIG. 4 in that the second region 202 is arranged in the diode portion 80. Other than that point, it has a structure similar to that in any aspect described in FIG. 1 to FIG. 4.

This example can suppress penetration of resin ions or the like into the diode portion 80. Since the diode portion 80 does not have a gate structure including the gate trench portion 40, the emitter region 12, and the base region 14, an influence on the threshold voltage Vth is small even if the second region 202 is arranged in the diode portion 80.

The second region 202 may be arranged in the entire diode portion 80 in the X axis direction. In another example, the diode portion 80 may include the first region 201 and the second region 202 mixed together in the X axis direction. The first region 201 may be arranged at a position in contact with the transistor portion 70 in the diode portion 80. The second region 202 may be arranged at a position in contact with the transistor portion 70 in the diode portion 80.

Also in this example, the first region 201 is arranged at a position closest to the diode portion 80 in the transistor portion 70. Note that a trench portion covered with the barrier metal 214 may be arranged at a boundary between the first region 201 and the diode portion 80.

Figure 6:
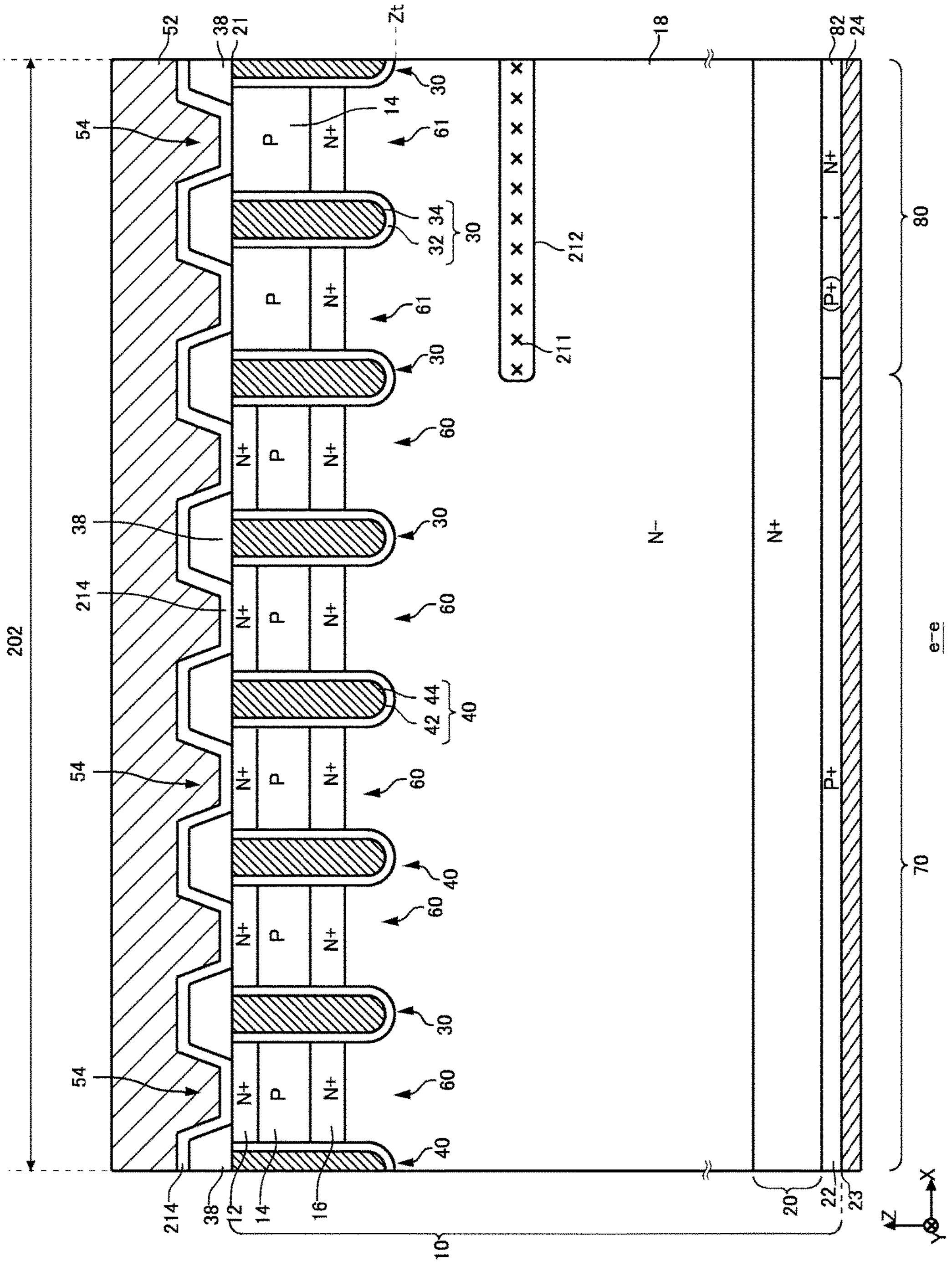
FIG. 6 illustrates another example of the cross section e-e.

FIG. 6 illustrates another example of the cross section e-e. This example is different from another example described in the present specification, in the first region 201 and the second region 202 in the transistor portion 70. Other than that point, a structure in this example is similar to that in any of the examples described in the present specification. The semiconductor device 100 may include a region having a configuration described in FIG. 3 or FIG. 5 and a region having a configuration described in FIG. 6 mixed together.

The transistor portion 70 in this example includes the second region 202 at a position closest to the diode portion 80 in the X axis direction. The entire transistor portion 70 in the X axis direction may be the second region 202. In the example shown in FIG. 6, the entire diode portion 80 in the X axis direction is the second region 202, but the entire diode portion 80 may be the first region 201, or the diode portion 80 may include both the first region 201 and the second region 202.

The transistor portion 70 in this example is not provided with the lifetime control region 212. The diode portion 80 is provided with the lifetime control region 212. The lifetime control region in this example is provided on a lower surface side of the dummy trench portion 30 in a top view. The lifetime control region in this example is not provided on a lower surface side of the gate trench portion 40 in a top view. The entire diode portion 80 in the X axis direction may be provided with the lifetime control region 212.

In this example, the transistor portion 70 is not provided with the lifetime control region 212, which can thus suppress a variation in the threshold voltage Vth. In addition, the barrier metal 214 can suppress penetration of resin ions or the like into the transistor portion 70 and the diode portion 80.

Figure 7:
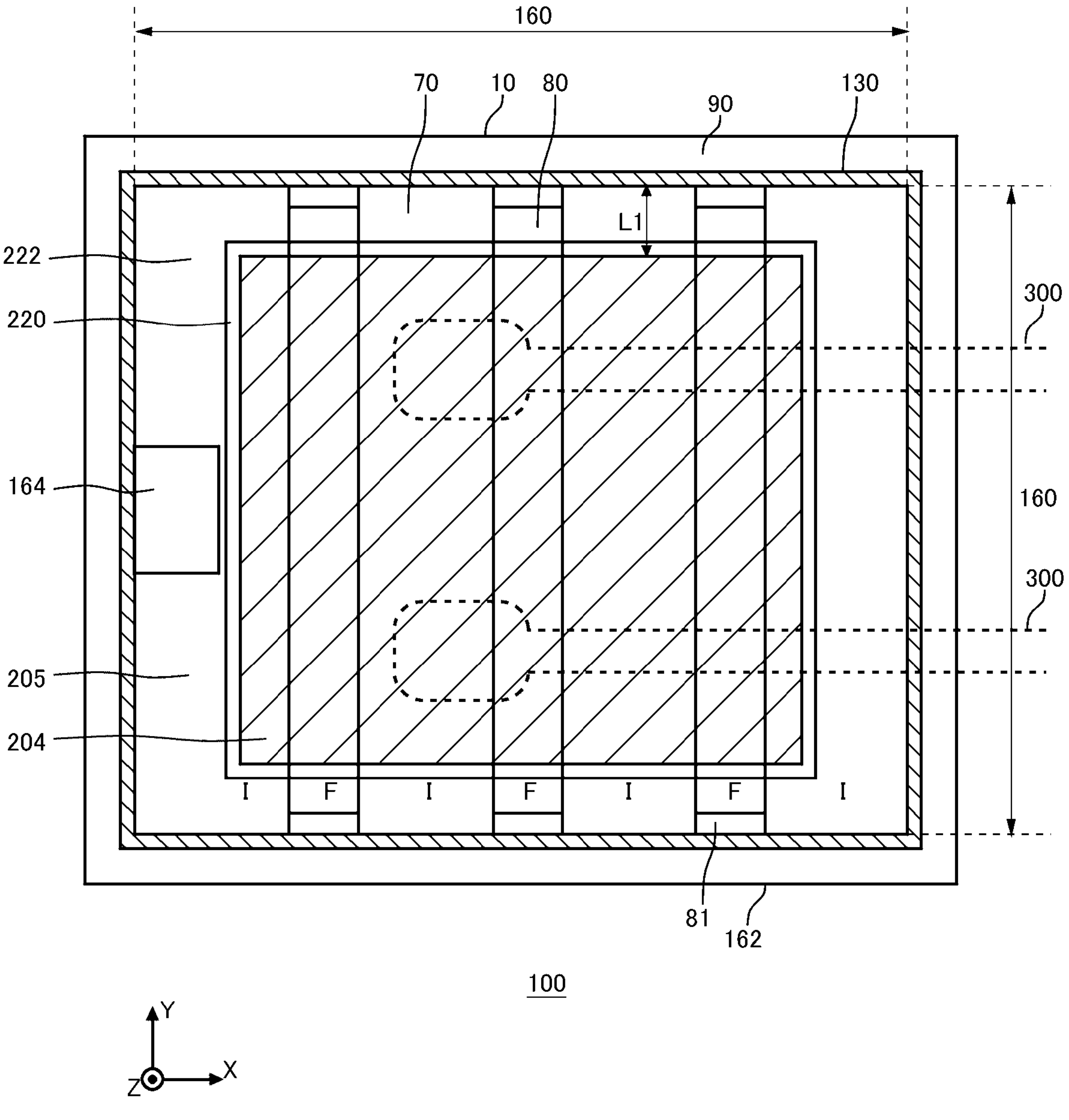
FIG. 7 illustrates an exemplary arrangement of a fourth region 204 and a fifth region 205 in a top view of a semiconductor substrate 10.

FIG. 7 illustrates an exemplary arrangement of a fourth region 204 and a fifth region 205 in a top view of the semiconductor substrate 10. The fourth region 204 and the fifth region 205 each include the transistor portion 70 and the diode portion 80. The fourth region 204 is a region hatched with wide-spaced diagonal lines in a top view of the active portion 160, and the fifth region 205 is a region other than the fourth region 204 in a top view of the active portion 160.

The transistor portion 70 in the fourth region 204 includes the first region 201 provided with the lifetime control region 212, at a position closest to the diode portion 80. For example, the fourth region 204 has any structure described in FIG. 3 or FIG. 5. The fourth region 204 in this example is a region where priority is given to suppressing a variation in the threshold voltage Vth of the transistor portion 70 in the vicinity of the diode portion 80.

The transistor portion 70 in the fifth region 205 includes the second region 202 not provided with the lifetime control region 212, at a position closest to the diode portion 80. For example, the fifth region 205 has the structure described in FIG. 6. The fifth region 205 in this example is a region where priority is given to suppressing penetration of resin ions or the like into the transistor portion 70 in the vicinity of the diode portion 80.

In a top view, the fifth region 205 in this example is arranged farther outward than the fourth region 204. The term outward may refer to a side closer to the end side 162 of the semiconductor substrate 10, or may refer to a side farther from a center in a top view of the semiconductor substrate 10. The fourth region 204 in this example is sandwiched between fifth regions 205 in a top view. That is, the fourth region 204 in this example is sandwiched between the fifth regions 205 in at least one direction parallel to an XY plane. In the example shown in FIG. 7, the fourth region 204 is enclosed by the fifth region 205. That is, the fourth region 204 in this example is sandwiched between the fifth regions 205 in all directions parallel to the XY plane.

Providing the fourth region 204 and the fifth region 205 can selectively arrange the region where priority is given to suppressing the variation in the threshold voltage Vth of the transistor portion 70 in the vicinity of the diode portion 80 and the region where priority is given to suppressing the penetration of the resin ions or the like into the transistor portion 70 in the vicinity of the diode portion 80. Arranging the fifth region 205 farther outward than the fourth region 204 can suppress the variation in the threshold voltage Vth in the vicinity of a center of the semiconductor substrate 10. In a top view, an area of the fourth region 204 may be larger than an area of the fifth region 205.

A protective film 222 such as polyimide is provided above the emitter electrode 52. The protective film 222 is provided with an opening 220 through which the emitter electrode 52 is exposed. The emitter electrode 52 is connected to a wiring line 300 such as a lead frame or a wire in the opening 220. In this example, two wiring lines 300 are connected to an upper surface of the emitter electrode 52 in the opening 220. The number of wiring lines 300 is not limited to this. Remaining stress applied to the emitter electrode 52 easily increases in the vicinity of a rim of the opening 220 in a top view. Thus, a deficit or a gap is easily generated in the emitter electrode 52 in the vicinity of the rim of the opening 220, which makes it easy for the resin ions or the like to penetrate into the semiconductor substrate 10.

In a top view, the fifth region 205 may be arranged below the rim of the opening 220. That is, in a top view, the rim of the opening 220 may overlap the fifth region 205. In a top view, the entire fourth region 204 may be arranged inside the opening 220. This configuration can arrange the barrier metal 214 in the vicinity of the rim of the opening 220, and suppress the penetration of the resin ions or the like into the semiconductor substrate 10.

In a top view, the rim of the opening 220 may be away from the fourth region 204. A shortest distance between the rim of the opening 220 and the fourth region 204 may be 10 μm or greater, may be 30 μm or greater, may be 50 μm or greater, or may be 100 μm or greater. In a top view, a shortest distance L1 from an end portion on an outer circumferential side of the active portion 160 to an end portion in contact with the fourth region 204 among end portions of the fifth region 205 may be 10 μm or greater and 100 μm or smaller. The distance L1 may be 20 μm or greater, may be 80 μm or smaller, may be 40 μm or greater, or may be 60 μm or smaller.

Figure 8:
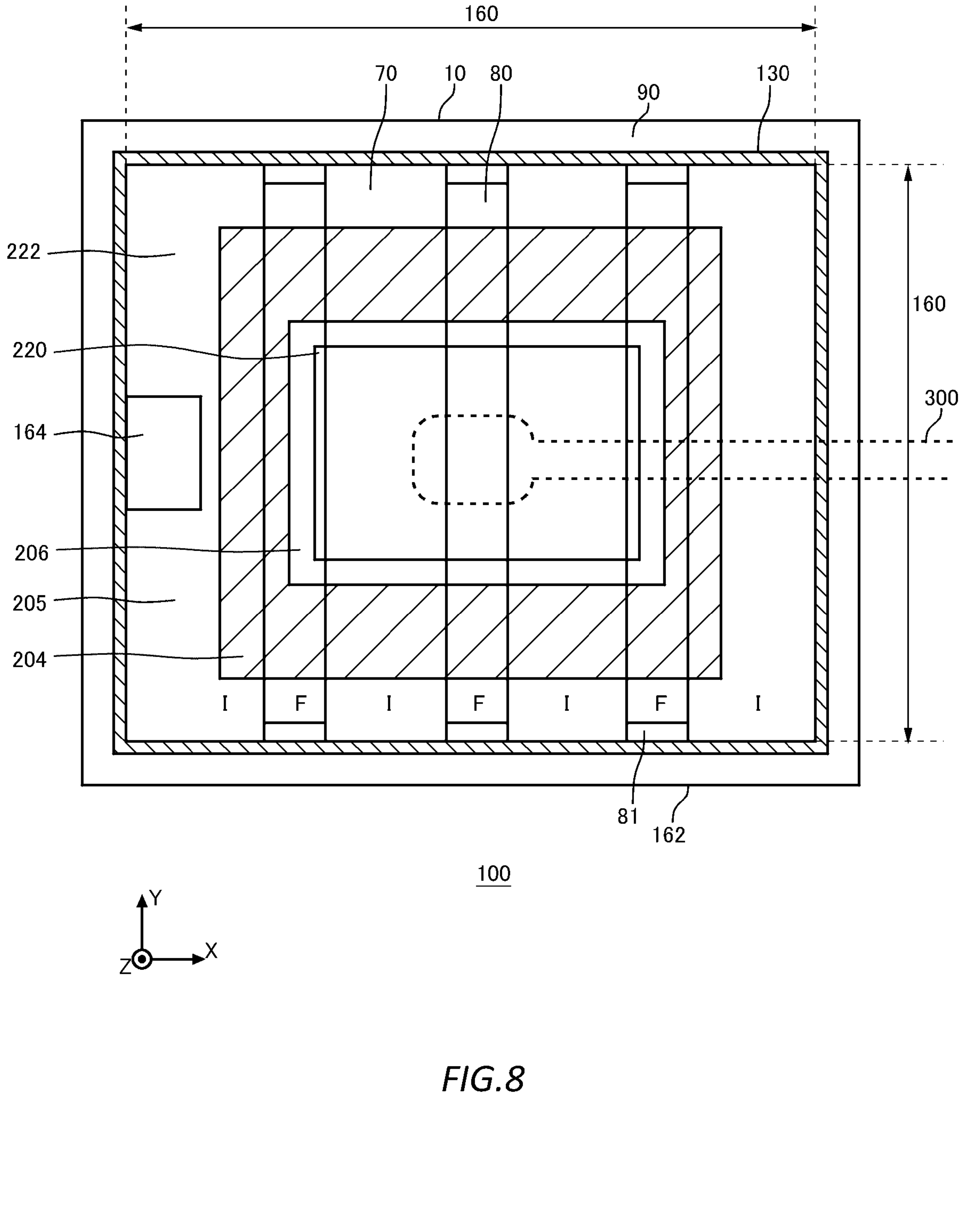
FIG. 8 illustrates another exemplary configuration in a top view of the semiconductor substrate 10.

FIG. 8 illustrates another exemplary configuration in a top view of the semiconductor substrate 10. The semiconductor device 100 in this example is different from that in the example described in FIG. 7 in that it includes a sixth region 206. Other than that point, it has a structure similar to that in any aspect described in FIG. 7.

The sixth region 206 includes the transistor portion 70 and the diode portion 80. The transistor portion 70 in the sixth region 206 includes the second region 202 not provided with the lifetime control region 212, at a position closest to the diode portion 80. For example, the sixth region 206 has the structure described in FIG. 6. The sixth region 206 may have a structure similar to that of the fifth region 205. The sixth region 206 in this example is a region where priority is given to suppressing penetration of resin ions or the like into the transistor portion 70 in the vicinity of the diode portion 80.

In a top view, the sixth region 206 is enclosed by the fourth region 204. This configuration can also selectively arrange the region where priority is given to suppressing the variation in the threshold voltage Vth of the transistor portion 70 in the vicinity of the diode portion 80 and the region where priority is given to suppressing the penetration of the resin ions or the like into the transistor portion 70 in the vicinity of the diode portion 80.

The protective film 222 in this example may include the opening 220 inside the sixth region 206 in a top view. The sixth region 206 is arranged below a rim of the opening 220. This structure can arrange the barrier metal 214 in the vicinity of the rim of the opening 220, and suppress the penetration of the resin ions or the like into the semiconductor substrate 10. The semiconductor device 100 may not include the fifth region 205. That is, a region other than the sixth region 206 in the active portion 160 may be the fourth region 204. In a top view, an area of the fourth region 204 may be larger than an area of the sixth region 206. In this example, one wiring line 300 is connected to an upper surface of the emitter electrode 52 in the opening 220. The number of wiring lines 300 is not limited to this.

As shown in FIG. 7 and FIG. 8, the fourth region 204, the fifth region 205, and the sixth region 206 may be rectangular regions (for example, the sixth region 206 in FIG. 8) or band-like regions (for example, the fourth region 204 and the fifth region 205 in FIG. 8) arranged along an outer shape of a rectangle. Each side of the rectangular regions may be parallel to either the X axis or the Y axis. However, shapes of the fourth region 204, the fifth region 205, and the sixth region 206 are not limited to this.

Figure 9:
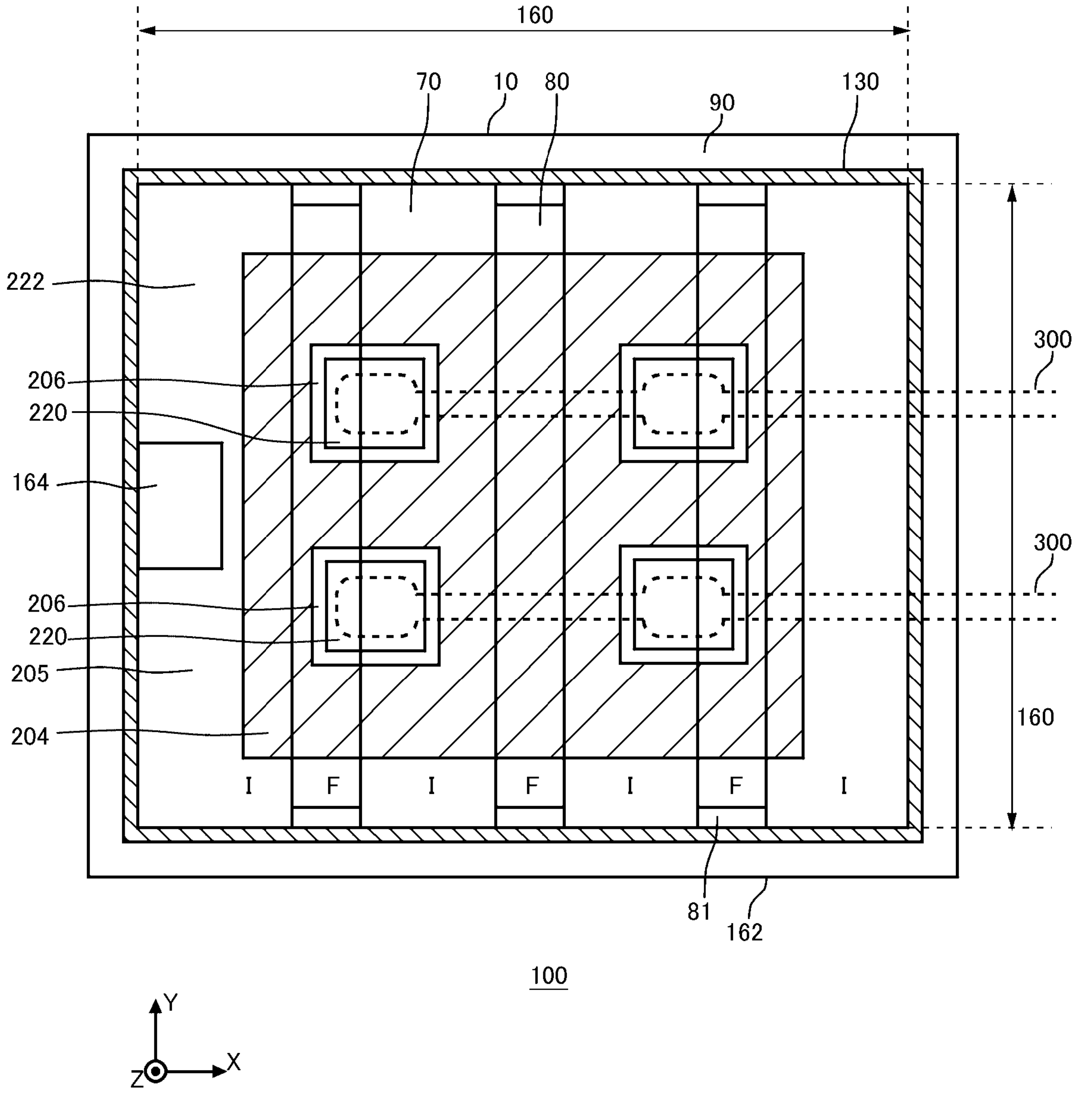
FIG. 9 illustrates another exemplary configuration in a top view of the semiconductor substrate 10.

FIG. 9 illustrates another exemplary configuration in a top view of the semiconductor substrate 10. The semiconductor device 100 in this example is different from that in the example described in FIG. 8 in that it includes a plurality of sixth regions 206. Other than that point, it has a structure similar to that in any aspect described in FIG. 8.

The protective film 222 in this example may include the opening 220 inside each sixth region 206 in a top view. The sixth region 206 is arranged below a rim of each opening 220. This structure can arrange the barrier metal 214 in the vicinity of the rim of the opening 220, and suppress penetration of resin ions or the like into the semiconductor substrate 10. In this example, one wiring line 300 is connected to an upper surface of the emitter electrode 52 in each opening 220. The number of wiring lines 300 may correspond to the number of openings 220, or may be smaller than the number of openings 220 due to stitch connection. In this example, the number of wiring lines 300 is two, which is smaller than the number of openings 220, which is four, due to the stitch connection. The number of wiring lines 300 and the number of openings 220 are not limited to this example.

Figure 10:
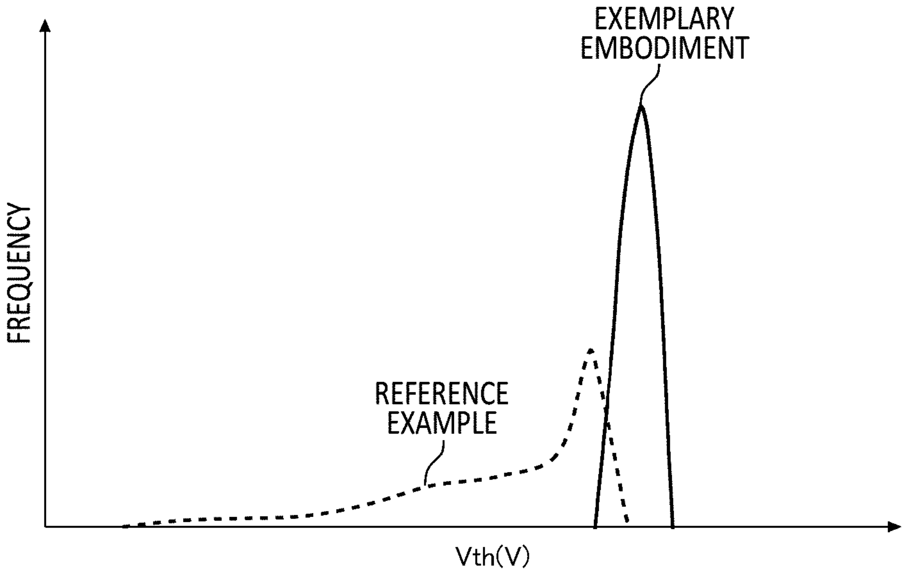
FIG. 10 illustrates examples of distributions of threshold voltages Vth of a plurality of semiconductor devices 100.

FIG. 10 illustrates examples of distributions of threshold voltages Vth of a plurality of semiconductor devices 100. The horizontal axis in FIG. 10 represents the threshold voltage Vth, and the vertical axis represents the number (a frequency of appearance) of semiconductor devices 100 having each threshold voltage Vth. In FIG. 10, a solid line indicates a distribution of the threshold voltages Vth of the semiconductor device 100 according to the exemplary embodiments described in FIG. 1 to FIG. 9, and a broken line indicates a distribution of the threshold voltages Vth of a semiconductor device according to a reference example. The semiconductor device according to the reference example is entirely the second region 202, and does not include the first region 201.

In the reference example, since the first region 201 is not provided, damage in the semiconductor substrate 10 is not recovered, and the threshold voltages Vth are distributed over a wide range. In contrast, in the exemplary embodiments, since the first region 201 is provided, the damage in the semiconductor substrate 10 is easily recovered, and a variation in the threshold voltage Vth is small.

Figure 11:
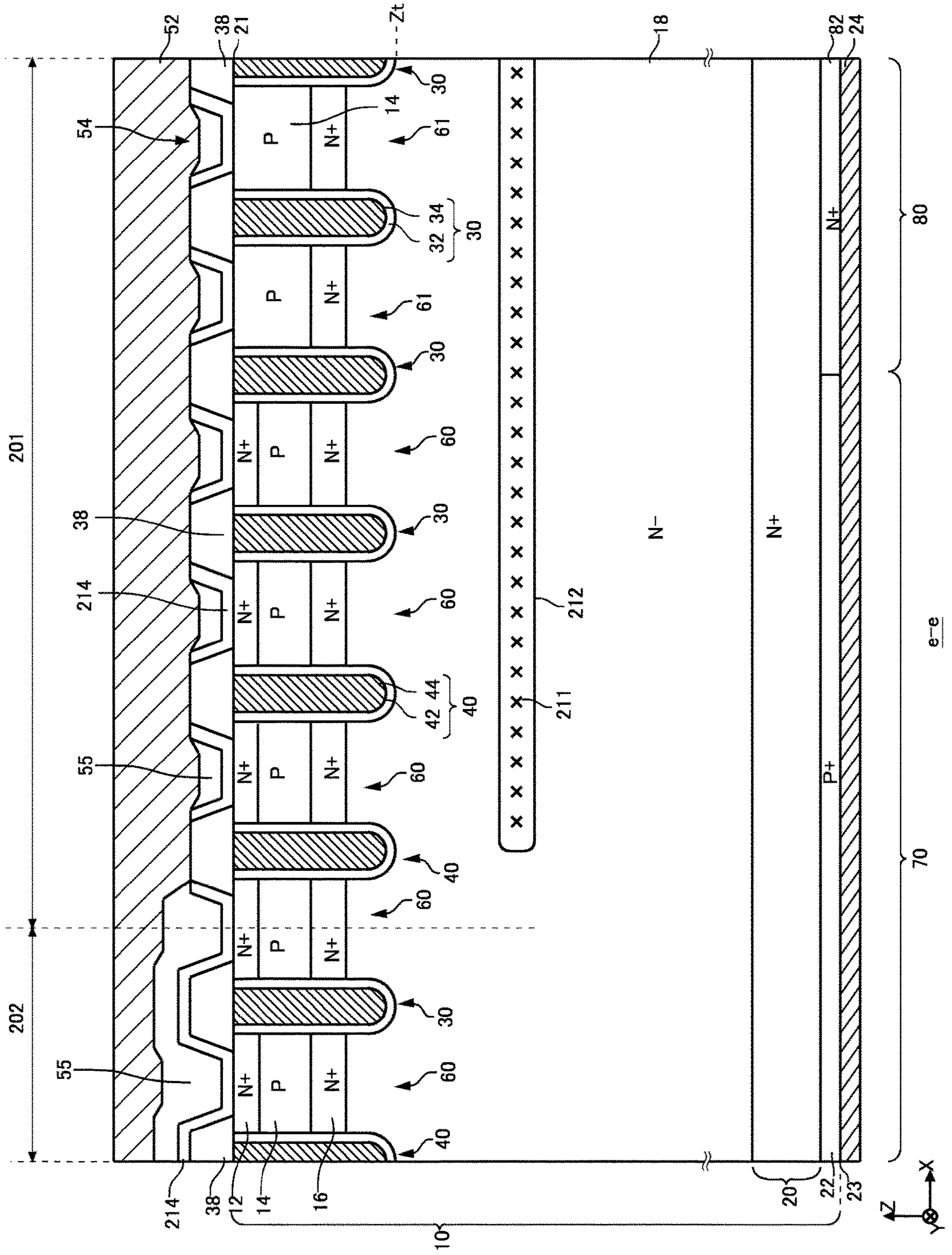
FIG. 11 illustrates another example of the cross section e-e.

FIG. 11 illustrates another example of the cross section e-e. The semiconductor device 100 in this example is different from that in another example described in the present specification in that it includes a plug portion 55. Other than the plug portion 55, it has a structure similar to that in any aspect described in the present specification.

The plug portion 55 is a metal layer containing tungsten. Each contact hole 54 is filled with the plug portion 55. The plug portion 55 in this example is arranged between the barrier metal 214 and the emitter electrode 52 in the contact hole 54. This configuration can fill the contact hole 54 with a conductive material, and can improve reliability of electrical connection between the emitter electrode 52 and the semiconductor substrate 10, even if the contact hole 54 is miniaturized.

In the first region 201, the barrier metal 214 and the plug portion 55 are not provided between a trench portion and the emitter electrode 52. This configuration can facilitate introduction of hydrogen into the semiconductor substrate 10.

In the second region 202, the barrier metal 214 and the plug portion 55 are provided between the trench portion and the emitter electrode 52. This configuration can further suppress penetration of resin ions or the like into the semiconductor substrate 10. The plug portion 55 may be provided above the entire barrier metal 214.

Figure 12:
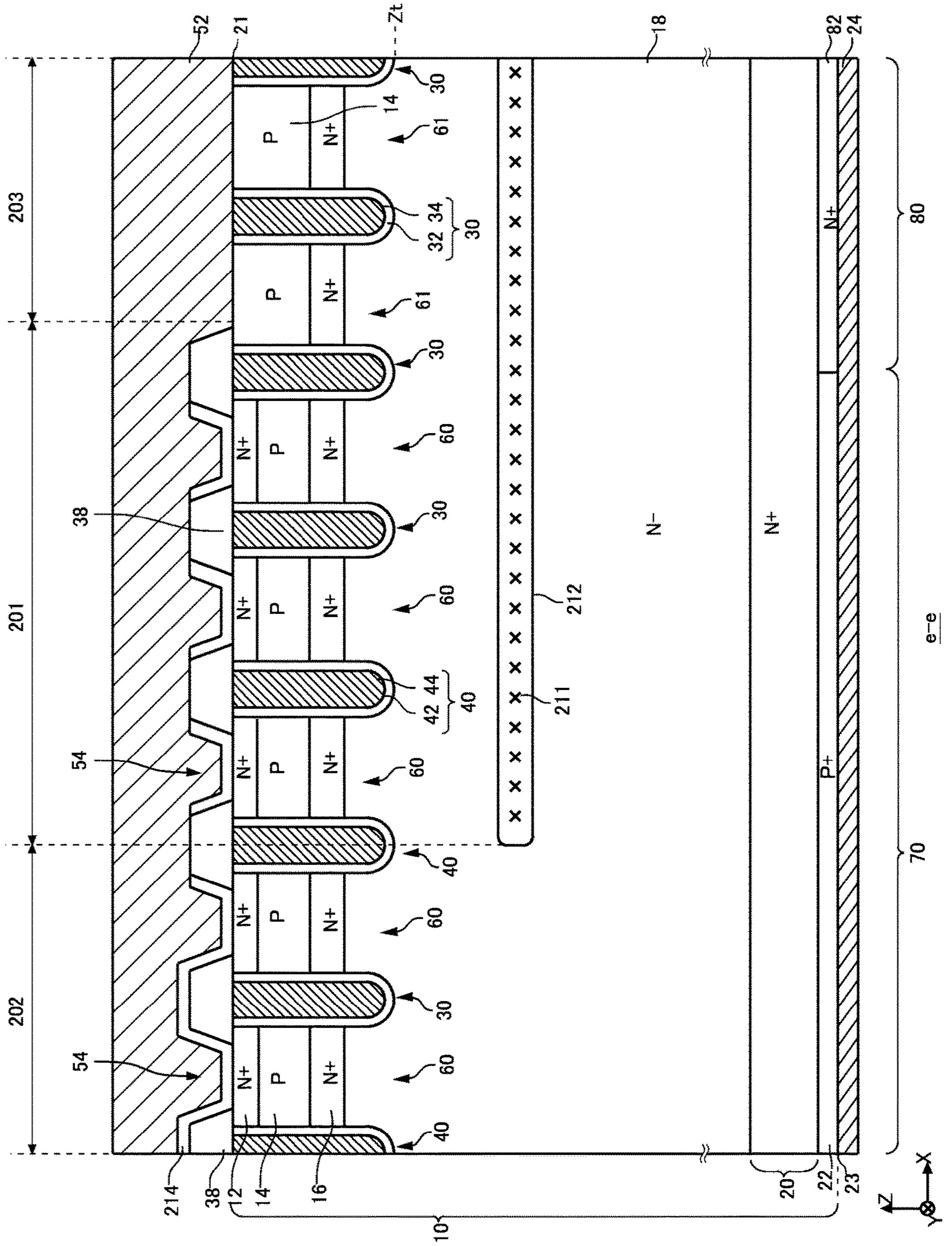
FIG. 12 illustrates another example of the cross section e-e.

FIG. 12 illustrates another example of the cross section e-e. The semiconductor device 100 in this example is different from that in another example described in the present specification in that it includes the first region 201 and the third region 203. The semiconductor device 100 may further include the second region 202. Other than the third region 203, it has a structure similar to that in any aspect described in the present specification.

The third region 203 is a region where the barrier metal 214 is not provided between a trench portion and the emitter electrode 52 and where the barrier metal 214 is not provided between the mesa portion in contact with the trench portion not provided with the barrier metal 214 and the emitter electrode 52, either. In the third region 203 in this example, the interlayer dielectric film 38 is not provided above the trench portion.

The first region 201, the second region 202, and the third region 203 are provided in the active portion 160. The third region 203 is arranged in the diode portion 80. The entire diode portion 80 in the X axis direction may be the third region 203. Note that the interlayer dielectric film 38 may be provided above the trench portion at a boundary between the diode portion 80 and the transistor portion 70. In the third region 203, the emitter electrode 52 may be in contact with the upper surface 21 of the semiconductor substrate 10 and the trench portion.

In this example, the first region 201 is arranged closest to the diode portion 80 in the transistor portion 70. The entire transistor portion 70 in the X axis direction may be the first region 201, and as shown in FIG. 3 and FIG. 5, the transistor portion 70 may include the first region 201 and the second region 202.

The lifetime control region 212 may be provided in both the first region 201 and the third region 203. The lifetime control region 212 in this example is provided in the entire first region 201 and third region 203 in the X axis direction. This example can also suppress a variation in the threshold voltage Vth in the transistor portion 70. In addition, damage in the diode portion 80 is easily recovered.

While the present invention has been described by way of the embodiments, the technical scope of the present invention is not limited to the scope described in the above-described embodiments. It is apparent to persons skilled in the art that various alterations or improvements can be made to the above-described embodiments. It is apparent from the description of the claims that embodiments added with such alterations or improvements can also be included in the technical scope of the present invention.

It should be noted that the operations, procedures, steps, stages, and the like of each process performed by an apparatus, system, program, and method shown in the claims, embodiments, or diagrams can be performed in any order as long as the order is not indicated by "prior to," "before," or the like and as long as the output from a previous process is not used in a later process. Even if the operation flow is described using phrases such as "first" or "next" in the claims, embodiments, or diagrams for convenience, it does not necessarily mean that the process must be performed in this order.

What is claimed is:

1. A semiconductor device formed on a semiconductor substrate including an upper surface and a lower surface, the semiconductor device comprising:

a plurality of trench portions which are formed from the upper surface of the semiconductor substrate to an inside of the semiconductor substrate and are arranged side by side in a first direction at the upper surface of the semiconductor substrate;

one or more mesa portions which are sandwiched between two trench portions among the plurality of trench portions;

an upper-surface electrode which is provided above the upper surface of the semiconductor substrate and does not contain a metal having a higher melting point than a material of the semiconductor substrate; and a barrier metal which is arranged between at least one of the mesa portions and the upper-surface electrode and contains the metal having the higher melting point than the material of the semiconductor substrate, and the semiconductor device including:

a first region where the barrier metal is not provided between the trench portion and the upper-surface electrode, where a first mesa portion is provided which is the mesa portion in contact with the trench portion not provided with the barrier metal, and where the barrier metal is provided between the first mesa portion and the upper-surface electrode; and a second region where the barrier metal is provided between the trench portion and the upper-surface electrode.

2. The semiconductor device according to claim 1, wherein the second region includes a second mesa portion which is the mesa portion in contact with the trench portion provided with the barrier metal, and the barrier metal is provided between the second mesa portion and the upper-surface electrode.

3. The semiconductor device according to claim 1, further including a third region where the barrier metal is not provided between the trench portion and the upper-surface electrode, where a third mesa portion is provided which is the mesa portion in contact with the trench portion not provided with the barrier metal, and where the barrier metal is not provided between the third mesa portion and the upper-surface electrode, either.

4. The semiconductor device according to claim 3, wherein the semiconductor device includes an active portion provided with a transistor portion and a diode portion in the semiconductor substrate, and the first region and the third region are provided in the active portion.

5. The semiconductor device according to claim 4, wherein the transistor portion and the diode portion are arranged side by side in the first direction, and the first region is arranged closest to the diode portion, in the transistor portion.

6. The semiconductor device according to claim 5, wherein the third region is arranged in the diode portion.

7. The semiconductor device according to claim 4, further comprising an interlayer dielectric film which is provided between the trench portion and the upper-surface electrode, wherein in the first region, the interlayer dielectric film above the trench portion and the upper-surface electrode are in contact with each other, and in the third region, the interlayer dielectric film is not provided above the trench portion.

8. The semiconductor device according to claim 4, further comprising a lifetime control region which is arranged on an upper surface side of the semiconductor substrate, wherein the lifetime control region is provided in the first region and the third region.

9. The semiconductor device according to claim 1, wherein the semiconductor device includes an active portion provided with a transistor portion and a diode portion in the semiconductor substrate, and the first region and the second region are provided in the active portion.

10. The semiconductor device according to claim 9, wherein the transistor portion and the diode portion are arranged side by side in the first direction, and the first region is arranged closest to the diode portion, in the transistor portion.

11. The semiconductor device according to claim 10, wherein the second region is arranged at a position farther away from the diode portion than the first region, in the transistor portion.

12. The semiconductor device according to claim 11, further comprising a lifetime control region which is arranged on an upper surface side of the semiconductor substrate, wherein the lifetime control region is provided in the first region arranged in the transistor portion, and the lifetime control region is not provided in the second region arranged in the transistor portion.

13. The semiconductor device according to claim 10, wherein the second region is arranged in the diode portion.

14. The semiconductor device according to claim 13, further comprising a lifetime control region which is arranged on an upper surface side of the semiconductor substrate, wherein the lifetime control region is provided in the first region arranged in the transistor portion, and the lifetime control region is provided in the second region arranged in the diode portion.

15. The semiconductor device according to claim 10, further comprising a lifetime control region which is arranged on an upper surface side of the semiconductor substrate, wherein the semiconductor device includes a fourth region and a fifth region each of which has the transistor portion and the diode portion, the transistor portion in the fourth region includes the first region provided with the lifetime control region, at a position closest to the diode portion, the transistor portion in the fifth region includes the second region not provided with the lifetime control region, at a position closest to the diode portion, and in a top view, the fifth region is arranged farther outward than the fourth region.

16. The semiconductor device according to claim 15, wherein in a top view, the fourth region is sandwiched between fifth regions including the fifth region.

17. The semiconductor device according to claim 16, wherein the semiconductor device includes a sixth region having the transistor portion and the diode portion, the transistor portion in the sixth region includes the second region not provided with the lifetime control region, at a position closest to the diode portion, and in a top view, the sixth region is enclosed by the fourth region.

18. The semiconductor device according to claim 15, further comprising a protective film which is provided above the upper-surface electrode, wherein the protective film includes an opening through which the upper-surface electrode is exposed, and in a top view, the fifth region is arranged below a rim of the opening.

19. The semiconductor device according to claim 18, wherein a wiring line is connected to the upper-surface electrode in the opening.

20. The semiconductor device according to claim 1, further comprising an interlayer dielectric film which is provided between the trench portion and the upper-surface electrode, wherein in the first region, the interlayer dielectric film above the trench portion and the upper-surface electrode are in contact with each other, and in the second region, the barrier metal is provided between the interlayer dielectric film above the trench portion and the upper-surface electrode.

21. The semiconductor device according to claim 1, wherein in the second region, tungsten is provided between the barrier metal above the trench portion and the upper-surface electrode, and in the first region, no tungsten is provided between the trench portion and the upper-surface electrode.

22. The semiconductor device according to claim 1, wherein the metal having the higher melting point than the material of the semiconductor substrate is any of titanium, molybdenum, tungsten, hafnium, vanadium, palladium, zirconium, niobium, nickel, cobalt, and platinum.

23. The semiconductor device according to claim 1, wherein at least one of the trench portions that is in contact with the first mesa portion provided in the first region is a gate trench portion.

* * * * *